(12) United States Patent
Tomoda et al.

(10) Patent No.: US 9,589,893 B2
(45) Date of Patent: Mar. 7, 2017

(54) SEMICONDUCTOR DEVICE, SEMICONDUCTOR DEVICE DESIGN METHOD, SEMICONDUCTOR DEVICE DESIGN APPARATUS, AND PROGRAM

(71) Applicant: Renesas Electronics Corporation, Kawasaki-shi (JP)

(72) Inventors: Masafumi Tomoda, Kanagawa (JP); Masayuki Tsukuda, Kanagawa (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/732,491

(22) Filed: Jun. 5, 2015

(65) Prior Publication Data

US 2015/0371950 A1    Dec. 24, 2015

Related U.S. Application Data

(63) Continuation of application No. 14/229,090, filed on Mar. 28, 2014, now Pat. No. 9,054,120, which is a
(Continued)

(30) Foreign Application Priority Data

Apr. 28, 2011   (JP) ................................ 2011-101656

(51) Int. Cl.
*G06F 17/50*     (2006.01)
*H01L 23/528*    (2006.01)
(Continued)

(52) U.S. Cl.
CPC .......... *H01L 23/5286* (2013.01); *H01L 23/50* (2013.01); *H01L 23/5386* (2013.01);
(Continued)

(58) Field of Classification Search
CPC ....................................................... G06F 17/50
(Continued)

(56) References Cited

U.S. PATENT DOCUMENTS 5,796,299 A * 8/1998 Sei ..................... H01L 27/11898
                                                  257/E27.11
6,212,089 B1 * 4/2001 Kajigaya ................ G11O 5/025
                                                  257/E23.02
(Continued)

FOREIGN PATENT DOCUMENTS

JP    H11-186500 A    7/1999
JP    2001-351983 A   12/2001

OTHER PUBLICATIONS

Japanese Office Action dated Jul. 1, 2014, with an English translation.
(Continued)

*Primary Examiner* — Thuan Do
(74) *Attorney, Agent, or Firm* — McGinn IP Law Group, PLLC

(57) ABSTRACT

A semiconductor device includes a semiconductor chip, which includes a substrate, a multilayer interconnect layer formed over the substrate, a first cell column disposed along an edge of the substrate in a plan view, the first cell column having a first I/O cell and a first power supply cell, second cell column disposed along the first cell column in plan view, the second cell column having a second I/O cell, a first pad supplying a first supply voltage to the first power supply cell, a first voltage supply wire disposed over the first cell column, a second voltage supply wire disposed over the second cell column, and a first connection wire crossing the first voltage supply wire and the second voltage supply wire.

14 Claims, 32 Drawing Sheets

Related U.S. Application Data continuation of application No. 13/452,801, filed on Apr. 20, 2012, now Pat. No. 8,713,508.

(51) Int. Cl.
  *H01L 23/50* (2006.01)
  *H01L 23/00* (2006.01)
  *H01L 23/538* (2006.01)
  *H01L 23/58* (2006.01)

(52) U.S. Cl.
  CPC .............. *H01L 23/58* (2013.01); *H01L 24/06* (2013.01); *H01L 24/49* (2013.01); *H01L 24/48* (2013.01); *H01L 2224/04042* (2013.01); *H01L 2224/05554* (2013.01); *H01L 2224/48091* (2013.01); *H01L 2224/48472* (2013.01); *H01L 2224/49175* (2013.01); *H01L 2224/49431* (2013.01); *H01L 2224/49433* (2013.01); *H01L 2924/00014* (2013.01); *H01L 2924/01005* (2013.01); *H01L 2924/01033* (2013.01)

(58) Field of Classification Search
  USPC ........................................................ 716/126
  See application file for complete search history.

(56) References Cited

U.S. PATENT DOCUMENTS

| | | |
|---|---|---|
| 6,721,933 B2 | 4/2004 | Iwasa |
| 6,798,075 B2 | 9/2004 | Liaw et al. |
| 7,005,887 B2 | 2/2006 | Anazawa |
| 7,501,710 B2 | 3/2009 | Nonoyama et al. |
| 7,595,561 B2 | 9/2009 | Ichikawa et al. |
| 8,013,362 B2 | 9/2011 | Matsuoka |
| 8,067,789 B2 | 11/2011 | Toyoshima et al. |
| 8,680,691 B2 | 3/2014 | Kariyazaki |
| 2001/0050423 A1 | 12/2001 | Kariyazaki |
| 2005/0116356 A1 | 6/2005 | Chang |
| 2007/0187808 A1 | 8/2007 | Mihelcic et al. |
| 2008/0169486 A1 | 7/2008 | Toyoshima et al. |
| 2010/0176504 A1 | 7/2010 | Kariyazaki |

OTHER PUBLICATIONS

Taiwan Office Action dated Dec. 2, 2015 with an English translation.

* cited by examiner

FIG. 5

|  | FIG. 3 (EMBODIMENT) | FIG. 4 (COMPARATIVE EXAMPLE) |
|---|---|---|
| THE NUMBER OF I/O CELLS | 11 | 9 |
| THE NUMBER OF POTENTIAL SUPPLY CELLS | 2 | 4 |
| THE NUMBER OF LONG WIRES CONNECTED TO POTENTIAL SUPPLY CELLS | 0 | 2 |

FIG. 10

|  | FIG. 7 (EMBODIMENT) | FIG. 8 (SECOND COMPARATIVE EXAMPLE) | FIG. 9 (THIRD COMPARATIVE EXAMPLE) |
|---|---|---|---|
| THE NUMBER OF I/O CELLS | 9 | 5 | 7 |
| THE NUMBER OF POTENTIAL SUPPLY CELLS | 2 | 6 | 4 |
| THE NUMBER OF LONG WIRES CONNECTED TO POTENTIAL SUPPLY CELLS | 0 | 4 | 2 |
| IS LAYOUT OF CIRCUIT INTERCONNECTS POSSIBLE IN REGION 32? | POSSIBLE | POSSIBLE | IMPOSSIBLE |

SEMICONDUCTOR DEVICE, SEMICONDUCTOR DEVICE DESIGN METHOD, SEMICONDUCTOR DEVICE DESIGN APPARATUS, AND PROGRAM

CROSS REFERENCE TO RELATED APPLICATIONS

This Application is a Continuation Application of U.S. patent application Ser. No. 14/229,090, filed on Mar. 28, 2014, which was a Continuation Application of U.S. patent application. Ser. No. 13/452,801 (now U.S. Pat. No. 8,713, 508 B2) which was filed on Apr. 20, 2012, the contents of which are hereby incorporated by reference.

This application is based on Japanese patent application No. 2011-101656, the content of which is incorporated hereinto by reference.

BACKGROUND

Technical Field

The present invention relates to a semiconductor device, a semiconductor device design method, a semiconductor device design apparatus, and a program.

Related Art

A semiconductor device is equipped with Input/Output (I/O) cells for input and output of signals to an external device. A power potential supply cell and a ground potential supply cell are also provided in the semiconductor device in order to supply electric power to the semiconductor device. These cells are provided along the edge of the semiconductor device in a plan view.

In recent years, as semiconductor devices have become smaller, one side of each semiconductor device has become shorter. Moreover, the number of pins in the semiconductor device is also increasing. Nevertheless, cells cannot be miniaturized below a certain extent. Thus, some studies have been made of a multiple-stage array of the cells.

For example, Japanese Patent Publication No. 3947119 discloses that the arrangement distance between inner peripheral side cells is made larger than the arrangement distance between outer peripheral side cells. Japanese Patent Publication No. 3259763 discloses that power supply interconnects of I/O cells provided in the same column are mutually connected and that a cell located at the inner peripheral side is made smaller than a cell located at the outer peripheral side. Japanese Laid-Open Patent Publication No. 2002-151590 discloses arraying long I/O cells in the longitudinal direction. Japanese Laid-Open Patent Publication No. 2008-141168 discloses that some portions include a multiple-stage array of the cells, whereas the other portions include one stage array of the cells. Japanese Laid-Open Patent Publication No. 2006-147610 discloses that in order to reduce the chip area, one I/O cell is divided into subblocks according to each function and that the arrangement and combination of the subblocks provide a function of one I/O cell.

U.S. Unexamined Patent Application Publication No. 2005/0116356 discloses arraying a ground cell, a power potential supply cell, and an I/O cell in this order from the outer peripheral side and connecting these cells to the inside region using interconnects of a lower layer. U.S. Pat. No. 6,798,075 discloses arraying pads with different voltage levels in different stages and then connecting the plurality of pads to one I/O cell. U.S. Unexamined Patent Application Publication No. 2007/0187808 discloses that a semiconductor chip with a multiple-stage array of cells is disposed on an interconnect substrate and that pads of the cells of the semiconductor chip is connected to interconnects on the interconnect substrate through bonding wires.

As semiconductor devices have become smaller in recent years, one side of each semiconductor device has become short. Additionally, as the number of semiconductor elements integrated in a semiconductor chip increases, the level of functionality realizable by the semiconductor chip has also been improved. In this case, since the number of input and output signals increases, the number of pins in the semiconductor device is also increasing. For this reason, it is necessary to array as many as possible I/O cells at one side of the semiconductor device. Thus, it is necessary to supply a power potential and a ground potential to each stage if cells are arrayed in multiple stages. In general, a power potential supply cell and a ground potential supply cell are provided in each stage. In this case, however, the number of I/O cells decreases as the number of power potential supply cells and the number of ground potential supply cells increase.

SUMMARY

In one embodiment, there is provided a semiconductor device comprising:
a semiconductor chip, the semiconductor chip including:
a substrate;
a multilayer interconnect layer formed over the substrate;
an outer peripheral cell column disposed along an edge of the substrate in a plan view, the outer peripheral cell column having at least one first I/O cell;
an inner peripheral cell column formed at an inner peripheral side of the outer peripheral cell column, the inner peripheral cell column having at least one second I/O cell;
a potential supply cell provided in at least either the outer peripheral cell column or the inner peripheral cell column, the potential supply cell being either a power potential supply cell or a ground potential supply cell;
electrode pads formed in the uppermost interconnect layer of the multilayer interconnect layer, wherein the first I/O cell, the potential supply cell, at least one of the electrode pads being provided in the first I/O cell, at least one of the electrode pads being provided in the potential supply cell, at least one of the electrode pads being provided in the second I/O cell;
a first potential supply interconnect provided in an interconnect layer below the uppermost interconnect layer, the first potential supply interconnect being extending in the same direction as the outer peripheral cell column, the first potential supply interconnect being connected to the first I/O cell;
a second potential supply interconnect provided in another or the interconnect layer below the uppermost interconnect layer, the second potential supply interconnect being extending in the same direction as the inner peripheral cell column, the second potential supply interconnect being located at an inner peripheral side of the first potential supply interconnect in a plan view, the second potential supply interconnect being connected to the second I/O cell; and
a potential-supply connection interconnect connecting the first potential supply interconnect and the second potential supply interconnect,
wherein the potential supply cell directly connects to either one of the first potential supply interconnect or the second potential supply interconnect, and the potential supply cell connects through the one and the potential-supply connection interconnect to the other one of the first potential supply interconnect or the second potential supply interconnect.

In the semiconductor device according to the embodiment of the present invention, the potential supply cell is provided in either the inner peripheral cell column or the outer peripheral cell column. The second potential supply interconnect located below the inner peripheral cell column and the first potential supply interconnect located below the outer peripheral cell column are connected to each other using the potential-supply connection interconnect. Either the first potential supply interconnect or the second potential supply interconnect is connected to the potential supply cell. For this reason, even if a potential supply cell is not provided in either the inner peripheral cell column or the outer peripheral cell column, a predetermined electric potential can be supplied to both the inner peripheral cell column and the outer peripheral cell column. As a result, a larger number of I/O cells can be arrayed.

In another embodiment, there is provided a semiconductor device design method for designing a semiconductor device using a computer, comprising:

disposing an outer peripheral cell column including at least one first I/O cell along an edge of a substrate of the semiconductor device;

disposing at least one inner peripheral cell column including at least one second I/O cell at an inner peripheral side of the outer peripheral cell column;

disposing a potential supply cell in either the outer peripheral cell column or the inner peripheral cell column, the potential supply cell being either a power potential supply cell or a ground potential supply cell;

disposing a first potential supply interconnect in an interconnect layer below the uppermost interconnect layer, the first potential supply interconnect being extending in the same direction as the outer peripheral cell column, the first potential supply interconnect being connected to the first I/O cell;

disposing a second potential supply interconnect in another or the interconnect layer below the uppermost interconnect layer, the second potential supply interconnect being extending in the same direction as the inner peripheral cell column, the second potential supply interconnect being located at an inner peripheral side of the first potential supply interconnect in a plan view, the second potential supply interconnect being connected to the second I/O cell;

connecting the potential supply cell to either the first potential supply interconnect or the second potential supply interconnect that overlaps the potential supply cell; and disposing a potential-supply connection interconnect connecting the first potential supply interconnect to the second potential supply interconnect.

In still another embodiment, there is provided a semiconductor device design apparatus supporting design of a semiconductor device, comprising:

a cell arrangement unit:
disposing an outer peripheral cell column including at least one first I/O cell along an edge of a substrate of the semiconductor device;
disposing at least one inner peripheral cell column including at least one second I/O cell at an inner peripheral side of the outer peripheral cell column; and
disposing a potential supply cell in either the outer peripheral cell column or the inner peripheral cell column, the potential supply cell being either a power potential supply cell or a ground potential supply cell, a potential supply interconnect arrangement unit:
disposing a first potential supply interconnect in an interconnect layer below the uppermost interconnect layer, the first potential supply interconnect being extending in the same direction as the outer peripheral cell column, the first potential supply interconnect being connected to the first I/O cell;
disposing a second potential supply interconnect in another or the interconnect layer below the uppermost interconnect layer, the second potential supply interconnect being extending in the same direction as the inner peripheral cell column, the second potential supply interconnect being located at an inner peripheral side of the first potential supply interconnect in a plan view, the second potential supply interconnect being connected to the second I/O cell; and
connecting the potential supply cell to either the first potential supply interconnect or the second potential supply interconnect that overlaps the potential supply cell, and a connection interconnect arrangement unit disposing a potential-supply connection interconnect connecting the first potential supply interconnect to the second potential supply interconnect.

In still another embodiment, there is provided a program causing a computer to function as a semiconductor device design apparatus supporting design of a semiconductor device, the program causing the computer to have:

a function of:
disposing an outer peripheral cell column including at least one first I/O cell along an edge of a substrate of the semiconductor device;
disposing at least one inner peripheral cell column including at least one second I/O cell at an inner peripheral side of the outer peripheral cell column; and
disposing a potential supply cell in either the outer peripheral cell column or the inner peripheral cell column, the potential supply cell being either a power potential supply cell or a ground potential supply cell, a function of:
disposing a first potential supply interconnect in an interconnect layer below the uppermost interconnect layer, the first potential supply interconnect being extending in the same direction as the outer peripheral cell column, the first potential supply interconnect being connected to the first I/O cell;
disposing a second potential supply interconnect in another or the interconnect layer below the uppermost interconnect layer, the second potential supply interconnect being extending in the same direction as the inner peripheral cell column, the second potential supply interconnect being located at an inner peripheral side of the first potential supply interconnect in a plan view, the second potential supply interconnect being connected to the second I/O cell; and
connecting the potential supply cell to either the first potential supply interconnect or the second potential supply interconnect that overlaps the potential supply cell, and a function of disposing a potential-supply connection interconnect connecting the first potential supply interconnect to the second potential supply interconnect.

According to the embodiments of the present invention, a larger number of I/O cells can be arrayed.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 5 is a view showing the number of I/O cells, the number of power potential supply cells, the number of ground potential supply cells, and the number of long bonding wires connected to power potential supply cells and ground potential supply cells in the example shown in FIG. 3 and the example shown in FIG. 4;

FIG. 10 is a table showing advantages and disadvantages in the example shown in FIG. 7, the example shown in FIG. 8, and the example shown in FIG. 9;

DETAILED DESCRIPTION

Figure 1:
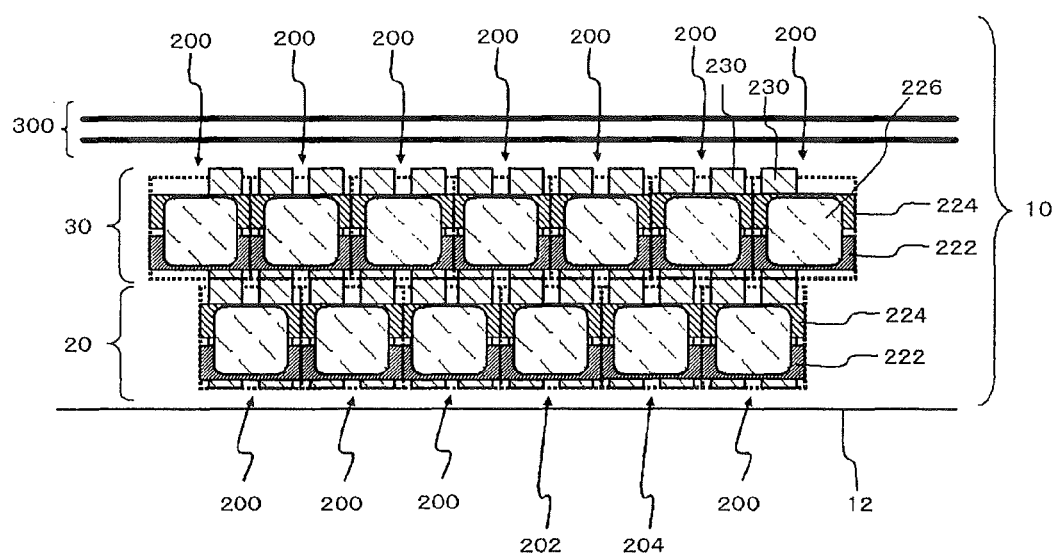
FIG. 1 is a plan view showing the configuration of a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the present invention will be described using the drawings. In addition, the same components are denoted by the same reference numerals in all drawings, and explanation thereof will not be repeated.

(First Embodiment)

FIG. 1 is a plan view showing the configuration of a semiconductor device according to a first embodiment. The semiconductor device has a semiconductor chip 10. The semiconductor chip 10 has a substrate (for example, a silicon substrate) and a multilayer interconnect layer formed on the substrate. In the semiconductor chip 10, an outer peripheral cell column 20 and an inner peripheral cell column 30 are arrayed in a plan view. The outer peripheral cell column 20 is a plurality of cells arrayed along the edge 12 of the substrate of the semiconductor chip 10 in a plan view. These cells include a plurality of I/O cells 200 (first I/O cells) and at least either a power potential supply cell 202 or a ground potential supply cell 204. The inner peripheral cell column 30 is formed at the inner peripheral side of the outer peripheral cell column 20 in a plan view, and includes a plurality of I/O cells 200 (second I/O cells). An electrode pad 226 is provided in each of the I/O cell 200, the power potential supply cell 202, and the ground potential supply cell 204. The electrode pad 226 is formed in the uppermost interconnect layer of the multilayer interconnect layer.

In an interconnect layer below the uppermost interconnect layer, a power potential supply interconnect 222 and a ground potential supply interconnect 224 (first potential supply interconnect) are provided in a region overlapping the outer peripheral cell column 20 in a plan view. The power potential supply interconnect 222 and the ground potential supply interconnect 224 extend in a direction along the outer peripheral cell column 20. The power potential supply interconnect 222 is connected to the power potential supply cell 202. The ground potential supply interconnect 224 is connected to the ground potential supply cell 204. The power potential supply interconnect 222 and the ground potential supply interconnect 224 supply a power potential and a ground potential, respectively, to the I/O cells 200 that form the outer peripheral cell column 20.

In an interconnect layer below the uppermost interconnect layer, the power potential supply interconnect 222 and the ground potential supply interconnect 224 (second potential supply wiring) are provided also in a region overlapping the inner peripheral cell column 30 in a plan view. The power potential supply interconnect 222 and the ground potential supply interconnect 224 extend in a direction along the inner peripheral cell column 30. In a plan view, such a power potential supply interconnect 222 and such a ground potential supply interconnect 224 are located at the inner peripheral side in relation to the power potential supply interconnect 222 and the ground potential supply interconnect 224 located below the outer peripheral cell column 20. The above power potential supply interconnect 222 and the ground potential supply interconnect 224 are connected to the I/O cells 200 that form the inner peripheral cell column 30. Thus, the power potential and the ground potential are supplied to the I/O cells 200.

A potential-supply connection interconnect 230 is provided in the multilayer interconnect layer. In a plan view, the potential-supply connection interconnect 230 overlaps some I/O cells 200 of the outer peripheral cell column 20 and some I/O cells 200 of the inner peripheral cell column 30. The potential-supply connection interconnect 230 connects the power potential supply interconnect 222 located below the outer peripheral cell column 20 to the power potential supply interconnect 222 located below the inner peripheral cell column 30. The potential-supply connection interconnect 230 also connects the ground potential supply interconnect 224 located below the outer peripheral cell column 20 to the ground potential supply interconnect 224 located below the inner peripheral cell column 30. One potential-supply connection interconnect 230 shown in FIG. 1 is formed by a bundle of a plurality of interconnects. Some of the interconnects (power connection interconnects) connect to the power potential supply interconnect 222, and the other interconnects (ground connection interconnects) connect to the ground potential supply interconnect 224.

In the example shown in FIG. 1, at least either the power potential supply cell 202 or the ground potential supply cell 204 is not provided in the inner peripheral cell column 30. Specifically, neither the power potential supply cell 202 nor the ground potential supply cell 204 is provided in the inner peripheral cell column 30. This makes it possible to array a larger number of I/O cells 200 in the inner peripheral cell column 30.

The potential-supply connection interconnect 230 is formed in an interconnect layer below the electrode pad 226. Specifically, in the example shown in FIG. 1, the power potential supply interconnect 222 and the ground potential supply interconnect 224 are formed in the same interconnect layer (an interconnect layer below the electrode pad 226). For example, the power potential supply interconnect 222 and the ground potential supply interconnect 224 are formed in the interconnect layer immediately below the electrode pad 226. The potential-supply connection interconnect 230 is formed in an interconnect layer below the power potential supply interconnect 222 and the ground potential supply interconnect 224. For example, the potential-supply connection interconnect 230 is formed in the interconnect layer immediately below the power potential supply interconnect 222 and the ground potential supply interconnect 224. If the power potential supply interconnect 222 and the ground potential supply interconnect 224 are formed in a much lower interconnect layer, the potential-supply connection interconnect 230 may be formed in an interconnect layer above the power potential supply interconnect 222 and the ground potential supply interconnect 224.

The potential-supply connection interconnect 230 may be provided over the electrode pad 226. In this case, however, the electrode pad 226 is hidden by the potential-supply connection interconnect 230 in a portion overlapping the potential-supply connection interconnect 230. This prevents input and output of signals through connecting a bonding wire to the electrode pad 226. For this reason, the I/O cells 200 cannot be provided in this case.

In the example shown in FIG. 1, each cell of the outer peripheral cell column 20 and each cell of the inner peripheral cell column 30 are alternately arrayed in a direction along the edge 12. Specifically, in the direction along the edge 12, the center of each cell of the outer peripheral cell column 20 and a boundary portion of each cell of the inner peripheral cell column 30 overlap each other. Moreover, in the direction along the edge 12, the center of the electrode pad 226 of the outer peripheral cell column 20 overlaps the center between the electrode pads 226 of the inner peripheral cell column 30.

In the outer peripheral cell column 20, the potential-supply connection interconnect 230 of the I/O cell 200 extends in a direction perpendicular to the edge 12. In the inner peripheral cell column 30, the potential-supply connection interconnect 230 extends in a direction perpendicular to the edge 12. The potential-supply connection interconnects 230 included in the outer peripheral cell column 20 are connected to the respective potential-supply connection interconnects 230 included in the inner peripheral cell column 30. That is, the plurality of potential-supply connection interconnects 230 extend in a direction perpendicular to the edge 12, and spread from the outer peripheral cell column 20 to the inner peripheral cell column 30.

In the example shown in FIG. 1, two potential-supply connection interconnects 230 are provided for one I/O cell 200. The two potential-supply connection interconnects 230 are disposed axisymmetrically with respect to the line perpendicular to the edge 12 passing through the center of the I/O cell 200. Specifically, the centerline of the potential-supply connection interconnects 230 is distant from the line passing through the center of the I/O cell 200 by ¼ of the width of the I/O cell 200.

In either the outer peripheral cell column 20 or the inner peripheral cell column 30 (in the example shown in FIG. 1, the inner peripheral cell column 30), the I/O cell 200 located at the end protrudes its half side from a cell of the other peripheral cell column (in the example shown in FIG. 1, the outer peripheral cell column 20). For this reason, unlike other I/O cells 200, the I/O cell 200 located at the end is not provided with the potential-supply connection interconnect 230 to be located at its half end side.

An inside circulating power supply interconnect 300 is provided inside the inner peripheral cell column 30. The inside circulating power supply interconnect 300 goes around the semiconductor chip 10, and supplies a power potential and a ground potential to an internal circuit of the semiconductor chip 10.

Figure 2:
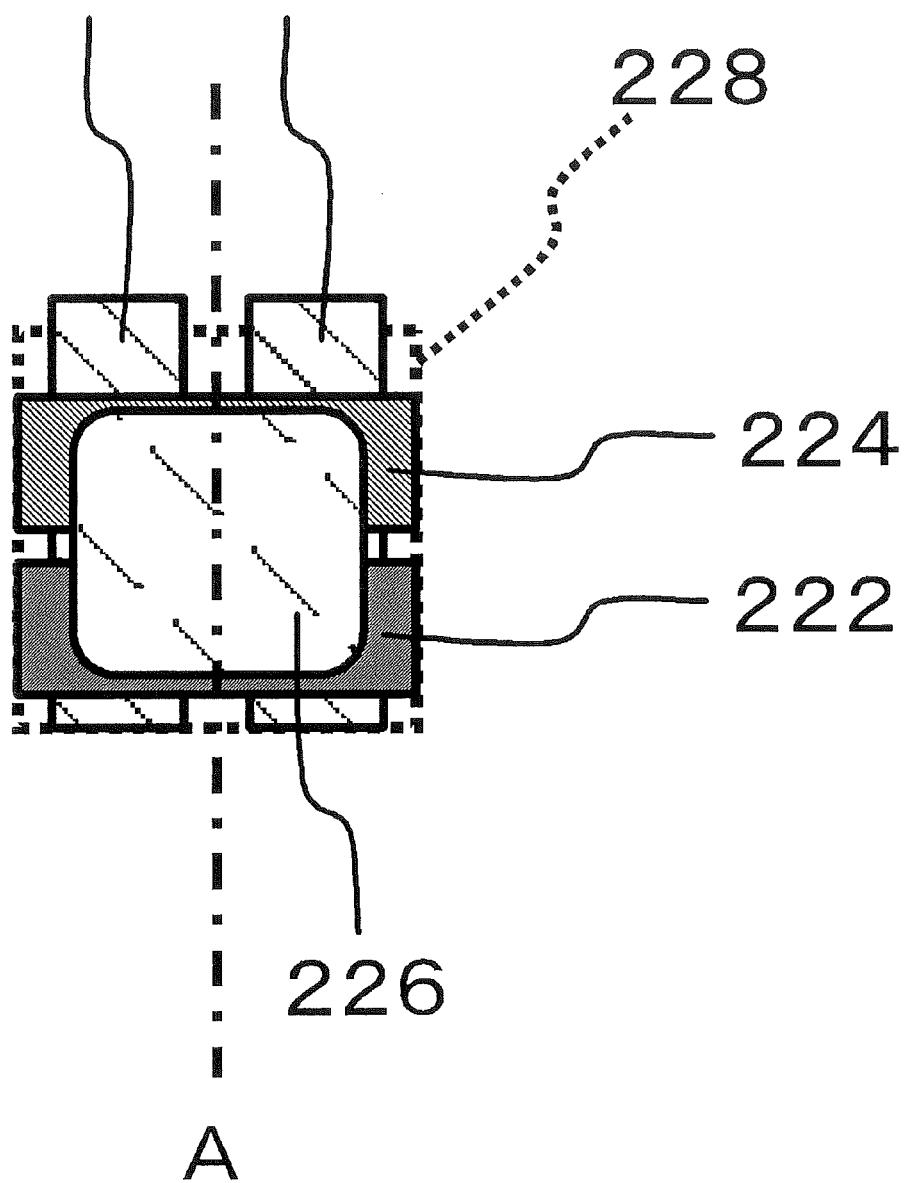
FIG. 2 is a plan view showing the configuration of an I/O cell shown in FIG. 1.

FIG. 2 is a plan view showing the configuration of the I/O cell 200 shown in FIG. 1. The I/O cell 200 has the electrode pad 226 and an element arrangement region 228. The element arrangement region 228 is a region where each element (for example, a transistor) of the I/O cell 200 is disposed. The center of the electrode pad 226 may overlap the center of the element arrangement region 228.

In addition, the I/O cell 200 has the power potential supply interconnect 222, the ground potential supply interconnect 224, and the potential-supply connection interconnect 230.

The power potential supply interconnect 222 and the ground potential supply interconnect 224 extend from one end to the other end of the I/O cell 200 in the width direction (the direction along the edge 12 in FIG. 1). The potential-supply connection interconnect 230 extends from one end to the other of the I/O cell 200 in the height direction (the direction perpendicular to the edge 12 in FIG. 1). If the I/O cells 200 are horizontally arrayed, the power potential supply interconnects 222 and the ground potential supply interconnects 224 are connected between the adjacent I/O cells 200.

The positions of the potential-supply connection interconnects 230 in the I/O cell 200 are so set that the potential-supply connection interconnects 230 can connect between the I/O cells 200 arrayed alternately in the vertical direction. The potential-supply connection interconnect 230 is repeated with the same shape in left and right halves of the I/O cell 200 in relation to the line A passing through the center of the I/O cell 200. In particular, in the example shown in FIG. 2, the two potential-supply connection interconnects 230 are axisymmetrical with respect to the line A passing through the center of the I/O cell 200, and the distance between the centers of the two potential-supply connection interconnects 230 is half of the distance between the centers of the I/O cells 200 adjacent to each other. The respective insides of the two potential-supply connection interconnects 230 include an interconnect for connecting the power potential supply interconnect 222 and an interconnect for connecting the ground potential supply interconnect 224 at the same position.

In addition, the I/O cell 200, the power potential supply cell 202, and the ground potential supply cell 204 have the same planar shape, and the arrangement of the power potential supply wiring 222, the ground potential supply wiring 224, and the potential-supply connection interconnect 230 is also the same. For this reason, these cells are compatible in determining the layout.

Figure 3:
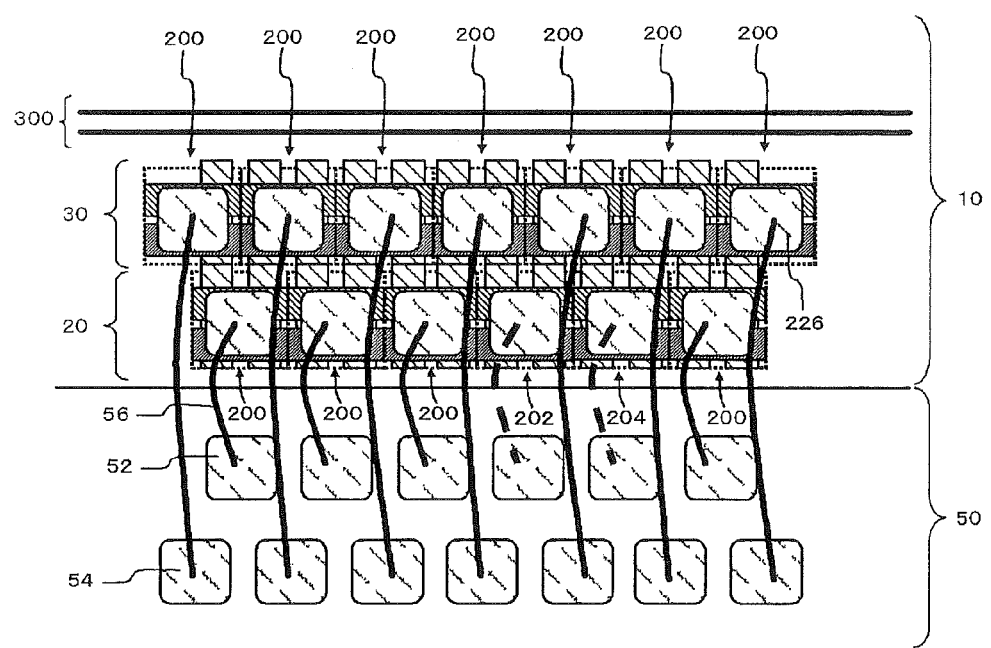
FIG. 3 is a plan view showing a semiconductor chip shown in FIG. 1 mounted on an interconnect substrate.

FIG. 3 is a plan view showing the semiconductor chip 10 shown in FIG. 1 mounted on an interconnect substrate 50. The wiring substrate 50 has a plurality of electrodes 52 to form a first electrode column and a plurality of electrodes 54 to form a second electrode column. The electrode 52 is located closer to the semiconductor chip 10 than the electrode 54 is. Each cell of the outer peripheral cell column 20 is connected to the electrode 52 through a bonding wire 56, and each cell of the inner peripheral cell column 30 is connected to the electrode 54 through the bonding wire 56. That is, the bonding wire 56 connecting the inner peripheral cell column 30 and the electrode 54 is longer than the bonding wire 56 connecting the outer peripheral cell column 20 and the electrode 52.

Next, operations and effects of the present embodiment will be described. According to the present embodiment, the power potential supply interconnect 222 and the ground potential supply interconnect 224 located below the inner peripheral cell column 30 are connected to the power potential supply interconnect 222 and the ground potential supply interconnect 224 located below the outer peripheral cell column 20 through the potential-supply connection interconnect 230. Therefore, even if the power potential supply cell 202 and the ground potential supply cell 204 are not provided in the inner peripheral cell column 30, the power potential and the ground potential can be supplied to the power potential supply interconnect 222 and the ground potential supply interconnect 224 located below the inner peripheral cell column 30. As a result, a larger number of I/O cells 200 can be arrayed in the inner peripheral cell column 30.

In addition, it is preferable that the bonding wire 56 connected to the power potential supply cell 202 and the ground potential supply cell 204 be short. In the present embodiment, the power potential supply cell 202 and the ground potential supply cell 204 are not provided in the inner peripheral cell column 30. For this reason, it is possible to suppress an increase in the length of the bonding wire 56 connected to the power potential supply cell 202 and the ground potential supply cell 204.

Figure 4:
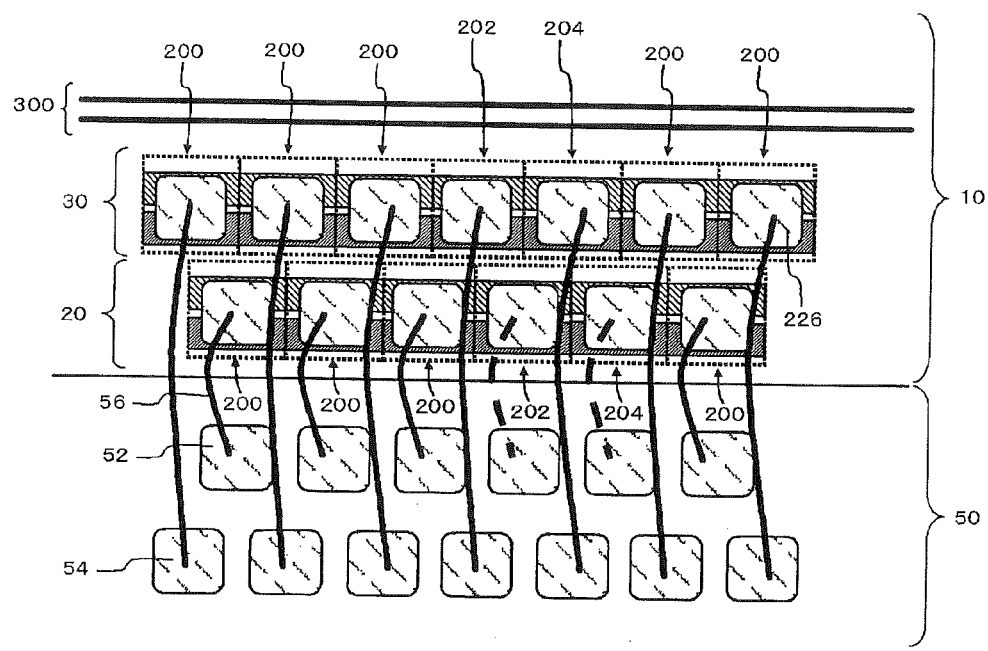
FIG. 4 is a plan view showing the configuration of a semiconductor device in a comparative example.

The above effect will be further described using FIGS. 4 and 5. FIG. 4 is a plan view showing the configuration of a semiconductor device in a comparative example, and corresponds to FIG. 3 in the first embodiment. In this comparative example, the potential-supply connection interconnect 230 is not provided. Instead, the power potential supply cell 202 and the ground potential supply cell 204 are provided in the inner peripheral cell column 30.

FIG. 5 shows the number of I/O cells 200 and the number of potential supply cells (power potential supply cells 202 and ground potential supply cells 204) and the number of long bonding wires connected to the potential supply cells in the first embodiment (example shown in FIG. 3) and the first comparative example (example shown in FIG. 4). Eleven I/O cells 200 are provided in the example shown in FIG. 3, while only nine I/O cells 200 are provided in the example shown in FIG. 4. This is because the number of potential supply cells in the example shown in FIG. 4 is larger by 2 than that in the example shown in FIG. 3. The number of long bonding wires connected to the potential supply cells is 0 in the example shown in FIG. 3, while the number of long bonding wires connected to the potential supply cells is 2 in the example shown in FIG. 4. Thus, the semiconductor device according to the first embodiment is advantageous compared with the semiconductor device in the first comparative example in various points.

Figure 6:
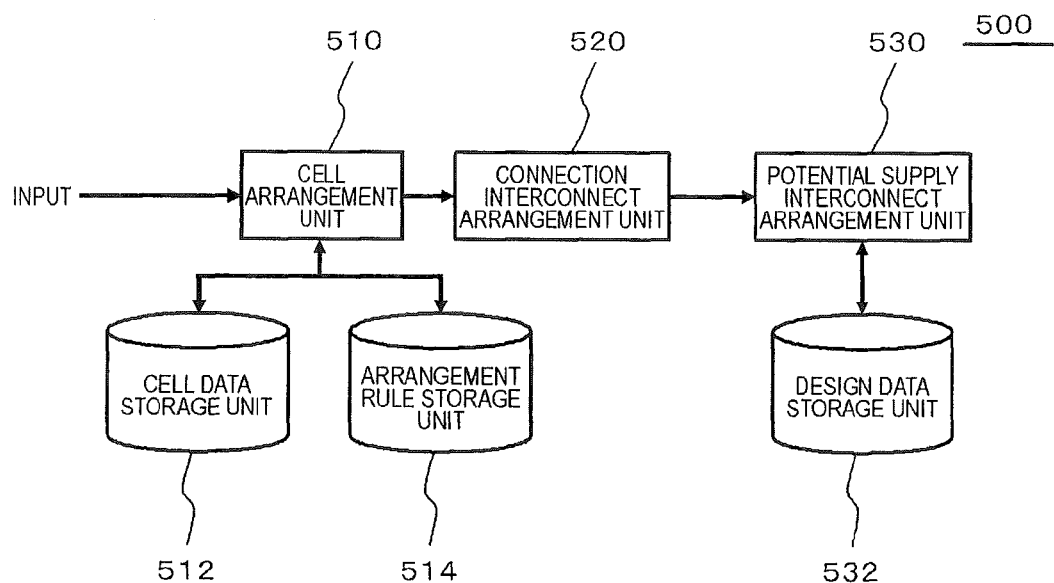
FIG. 6 is a block diagram showing the functional configuration of a semiconductor device design apparatus.

The semiconductor chip 10 may be formed using a semiconductor device design apparatus 500 shown in FIG. 6, for example. The semiconductor device design apparatus 500 has a cell arrangement unit 510, a connection interconnect arrangement unit 520, and a potential supply interconnect arrangement unit 530.

The cell arrangement unit 510 sets the layout of the outer peripheral cell column 20 and the inner peripheral cell column 30 according to an input from a designer. For example, when the designer inputs the arrangement of the electrode pad 226 as a layout of the outer peripheral cell column 20 and the inner peripheral cell column 30, the cell arrangement unit 510 disposes each cell according to the input. The cell arrangement unit 510 uses various kinds of data stored in a cell data storage unit 512 and an arrangement rule storage unit 514. The cell data storage unit 512 stores design data of the I/O cell 200, the power potential supply cell 202, and the ground potential supply cell 204. The cell data storage unit 512 does not include design data of the power potential supply interconnect 222 and the ground potential supply interconnect 224. The arrangement rule storage unit 514 stores the arrangement rules of the I/O cell 200, the power potential supply cell 202, and the ground potential supply cell 204. The cell arrangement unit 510 disposes a cell for filling the gap if necessary. Data of this cell is also stored in the cell data storage unit 512. In addition, the cell arrangement unit 510 verifies whether or not the layout of cells satisfies the arrangement rules stored in the arrangement rule storage unit 514 if necessary.

The connection interconnect arrangement unit 520 performs processing for disposing the potential-supply connection interconnect 230. Specifically, the potential-supply connection interconnect 230 is included in each of the I/O cell 200, the power potential supply cell 202, and the ground potential supply cell 204. The connection interconnect arrangement unit 520 checks whether or not the potential-supply connection interconnects 230 included in these cells are connected between the cells arranged in the vertical direction. Moreover, the connection interconnect arrangement unit 520 performs processing for treating these interconnects as one interconnect.

The potential supply interconnect arrangement unit 530 disposes the power potential supply interconnect 222 and the ground potential supply interconnect 224 according to the layout of the outer peripheral cell column 20 and the inner peripheral cell column 30 set by the cell arrangement unit 510. The design data processed in the potential supply interconnect arrangement unit 530 is stored in a design data storage unit 532.

Each component of the semiconductor device design apparatus 500 shown in FIG. 6 is not a configuration in a hardware unit but a block in a functional unit. Each component of the semiconductor device design apparatus 500 is realized by any combination of hardware and software based on a CPU of any computer, a memory, a program for realizing the component in this drawing loaded in the memory, a storage unit such as a hard disk storing the program, and an interface for network connection. In addition, there are various modifications in the implementation method and the apparatus.

In the present embodiment, both the power potential supply cell 202 and the ground potential supply cell 204 are disposed in the outer peripheral cell column 20. Nevertheless, one or both of the power potential supply cell 202 and the ground potential supply cell 204 may be provided only in the inner peripheral cell column 30 instead of the outer peripheral cell column 20. Also in this case, a larger number of I/O cells 200 can be arrayed if the number of the I/O cells 200 is assumed as a sum of the outer peripheral cell column 20 and the inner peripheral cell column 30.

Figure 32:
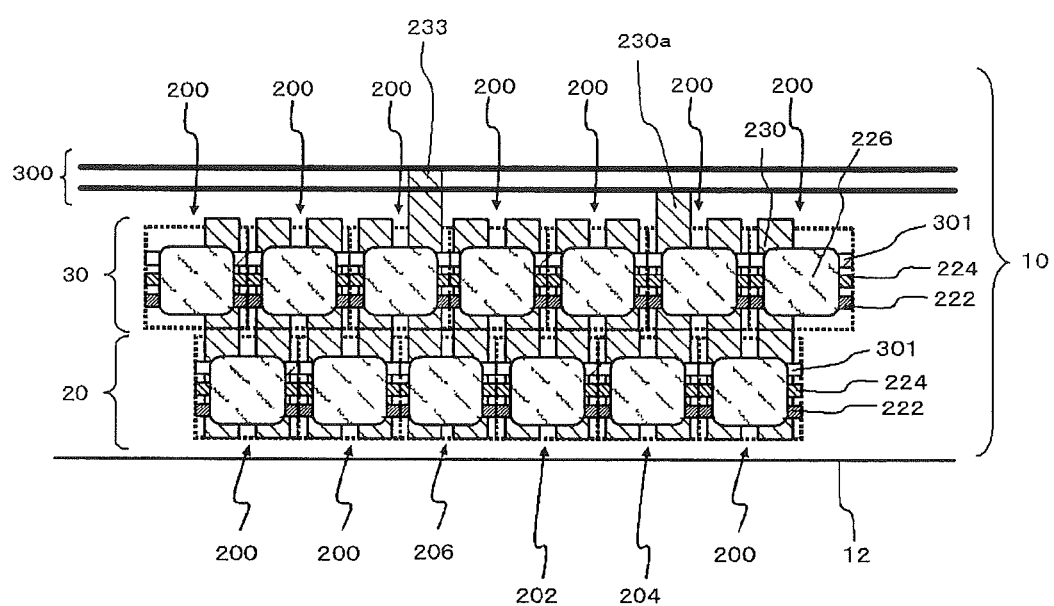
FIG. 32 is a sectional view showing the configuration of a semiconductor device in a modification of the first embodiment.

FIG. 32 is a plan view showing the configuration of a semiconductor chip 10 in a modification of the first embodiment, and corresponds to FIG. 1 in the first embodiment. The semiconductor chip 10 in this modification is the same as the semiconductor chip according to the first embodiment except for the following points.

First, one of the potential-supply connection interconnects 230 for supplying a ground potential (a potential-supply connection interconnect 230a in FIG. 32) is connected to one of the inside circulating power supply interconnects 300 for supplying a ground potential. That is, in the present embodiment, the ground potential supply cell 204 is a cell for supplying ground potential common between the internal circuit and I/O cells.

Each of the outer peripheral cell column 20 and the inner peripheral cell column 30 has a power supply interconnect 301 for the internal circuit. The power supply interconnect 301 for the internal circuit 301 are located at the same layer as the power potential supply interconnect 222, and extends in parallel to the power potential supply interconnect 222. Either the outer peripheral cell column 20 or the inner peripheral cell column 30 (the outer peripheral cell column 20 in the example shown in FIG. 32) has a power potential supply cell 206 for the internal circuit separate from a potential supply cell capacitive element 202 for the I/O cell 200. The power potential supply cell 206 supplies a power potential for the internal circuit to the inside circulating power supply interconnect 300 through an interconnect 233 at the same layer as the potential-supply connection interconnect 230. The power potential supply cell 206 also supplies a power potential for the internal circuit to the power supply interconnect 301. If an interconnect similar with the interconnect 233 is extended to the inside circulating power supply interconnect 300 at the arbitrary position of each of the outer peripheral cell column 20 and the inner peripheral cell column 30, the power potential of the inside circulating power supply interconnect 300 can be further stabilized. The power supply interconnect 301 is also included in the design data of the I/O cell 200.

Since a variation (power supply noise) in the power potential of the I/O cell 200 is large, the internal circuit may malfunction if the power supply noise transmits to the internal circuit. On the other hand, in the present embodiment, the power potential of the internal circuit and the power potential of the I/O cell 200 can be separated from each other. Accordingly, it is possible to reduce a possibility that the internal circuit malfunctions.

(Second Embodiment)

Figure 7:
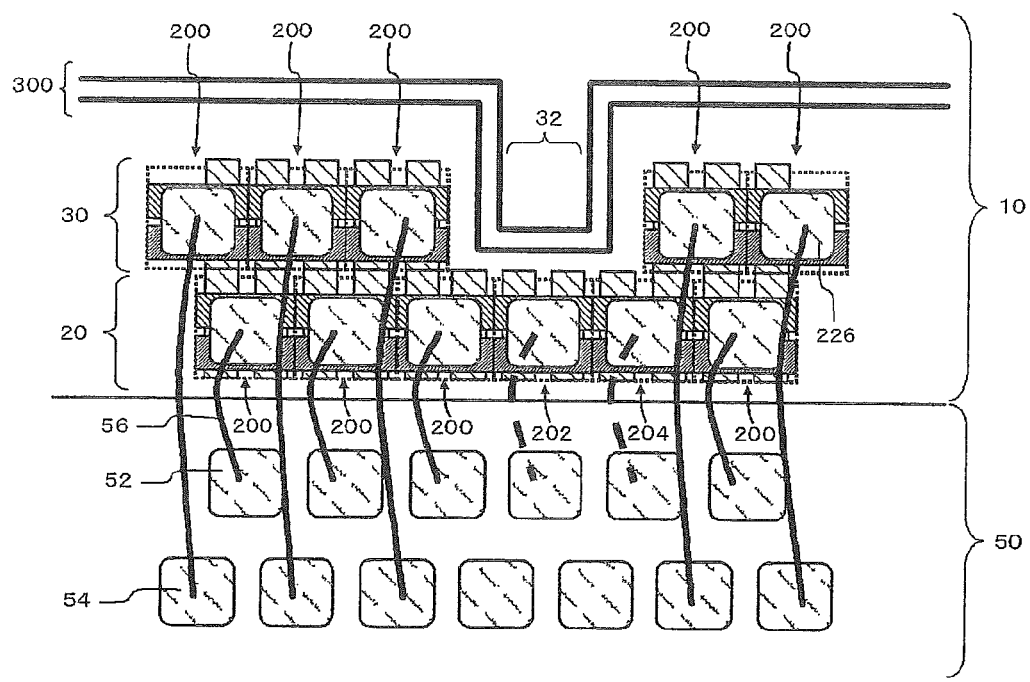
FIG. 7 is a plan view showing the configuration of a semiconductor device according to a second embodiment.

FIG. 7 is a plan view showing the configuration of a semiconductor device according to a second embodiment and corresponds to FIG. 3 in the first embodiment. The semiconductor device according to the present embodiment has the same configuration as the semiconductor device according to the first embodiment except that a region 32 where no I/O cell 200 is provided is present in the inner peripheral cell column 30 of the semiconductor chip 10.

Specifically, a plurality of I/O cells 200 are provided in the inner peripheral cell column 30. The region 32 is formed by thinning out some of the I/O cells 200. In the region 32, other interconnects (for example, interconnects for forming the internal circuit of the semiconductor chip 10) are routed in each interconnect layer in which the power potential supply interconnect 222, the ground potential supply interconnect 224, and the potential-supply connection interconnect 230 are formed.

Also in the present embodiment, the same effects as in the first embodiment can be achieved. The region 32 where no I/O cell 200 is provided is formed in the inner peripheral cell column 30. In the region 32, other interconnects can be routed in interconnect layers in which the power potential supply interconnect 222, the ground potential supply interconnect 224, and the potential-supply connection interconnect 230 are to be formed. As a result, the degree of freedom in routing of other interconnects is improved.

Figure 8:
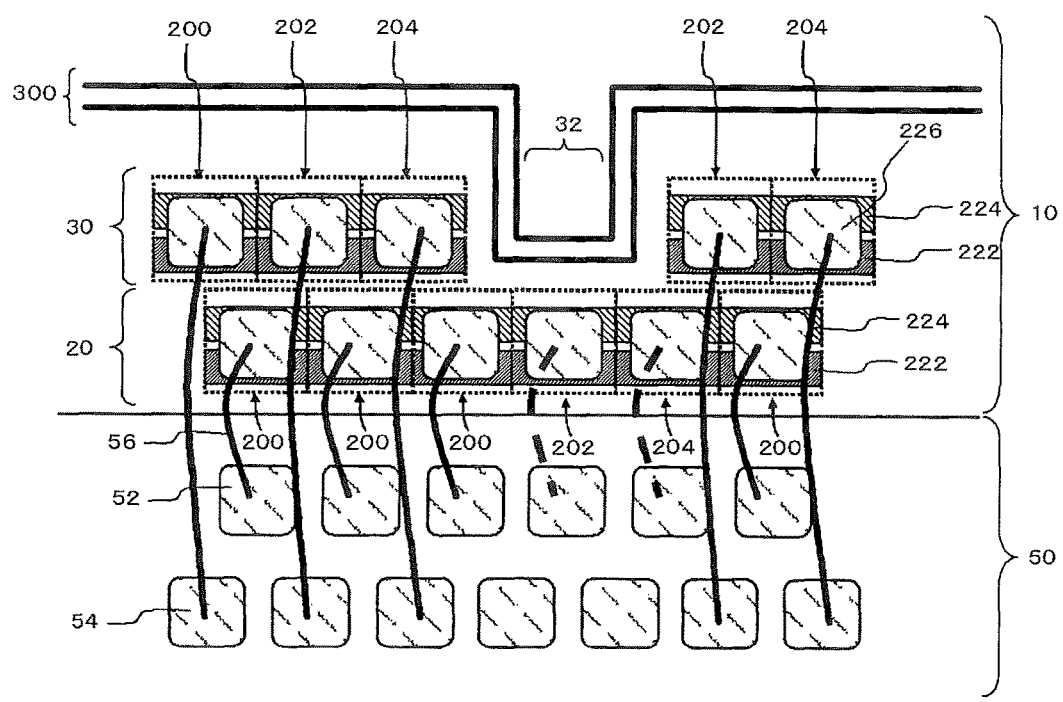
FIG. 8 is a plan view showing the configuration of a semiconductor device in a second comparative example.
Figure 9:
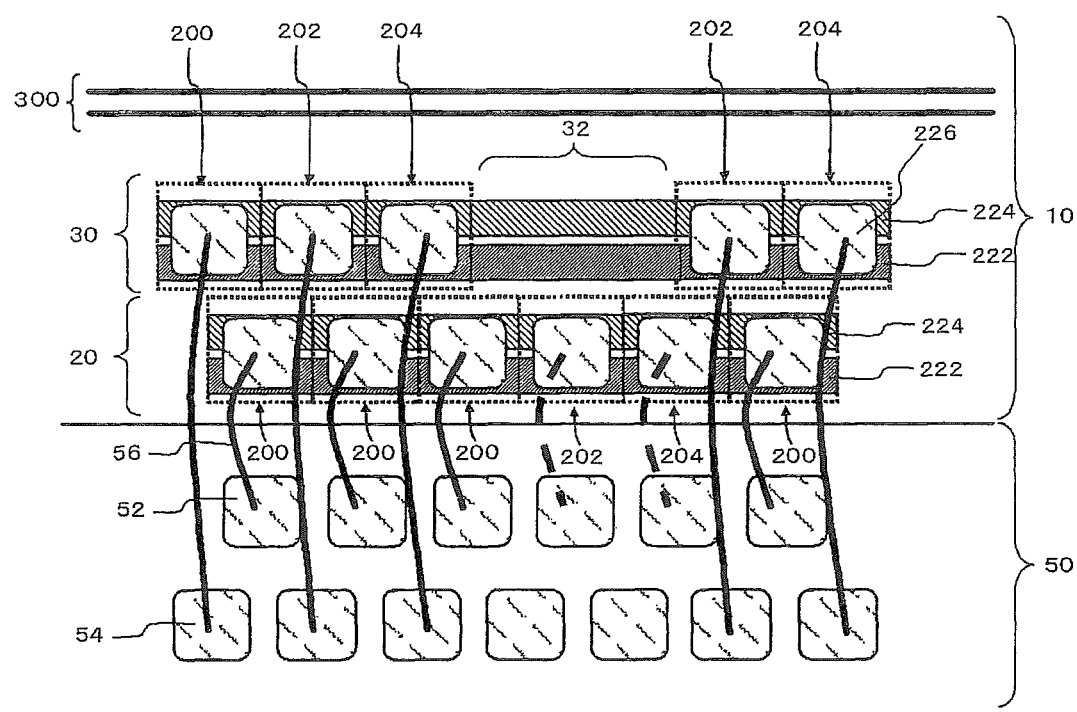
FIG. 9 is a plan view showing the configuration of a semiconductor device in a third comparative example.

The above effect will be further described using FIGS. 8 to 10.

FIG. 8 is a plan view showing the configuration of a semiconductor device in a second comparative example, and corresponds to FIG. 7 in the second embodiment. In the second comparative example, the potential-supply connection interconnect 230 is not provided. Instead, the power potential supply cell 202 and the ground potential supply cell 204 are provided in the inner peripheral cell column 30. Since the region 32 is provided, the power potential supply interconnects 222 and the ground potential supply interconnects 224 each are divided into two parts in the inner peripheral cell column 30. For this reason, it is necessary to provide the power potential supply cell 202 and the ground potential supply cell 204 for each set of the divided power potential supply interconnects 222 and ground potential supply interconnects 224.

FIG. 9 is a plan view showing the configuration of a semiconductor device in a third comparative example, and corresponds to FIG. 7 in the second embodiment. The third comparative example is the same as the comparative example shown in FIG. 8 except that the power potential supply interconnect 222 and the ground potential supply interconnect 224 are also formed in the region 32. Unlike the second embodiment, other interconnects cannot be formed in a portion of the region 32 where the power potential supply interconnect 222 and the ground potential supply interconnect 224 are formed.

FIG. 10 is a table showing advantages and disadvantages in the second embodiment (example shown in FIG. 7), the second comparative example (example shown in FIG. 8), and the third comparative example (example shown in FIG. 9). Nine I/O cells 200 are provided in the example shown in FIG. 7, while only five I/O cells 200 are provided in the example shown in FIG. 8 and only seven I/O cells 200 are provided in the example shown in FIG. 9. This is because the number of potential supply cells in the examples shown in FIGS. 8 and 9 is larger than that in the example shown in FIG. 7. The number of long bonding wires connected to the potential supply cells is 0 in the example shown in FIG. 7, while a plurality of long bonding wires connected to the potential supply cells are provided in the examples shown in FIGS. 8 and 9. Other interconnects may be disposed in the region 32 in the examples shown in FIGS. 7 and 8, while other interconnects cannot be disposed in the region 32 in the example shown in FIG. 9. Thus, the semiconductor device according to the second embodiment is advantageous compared with the semiconductor devices in the comparative examples in various points.

(Third Embodiment)

Figure 11:
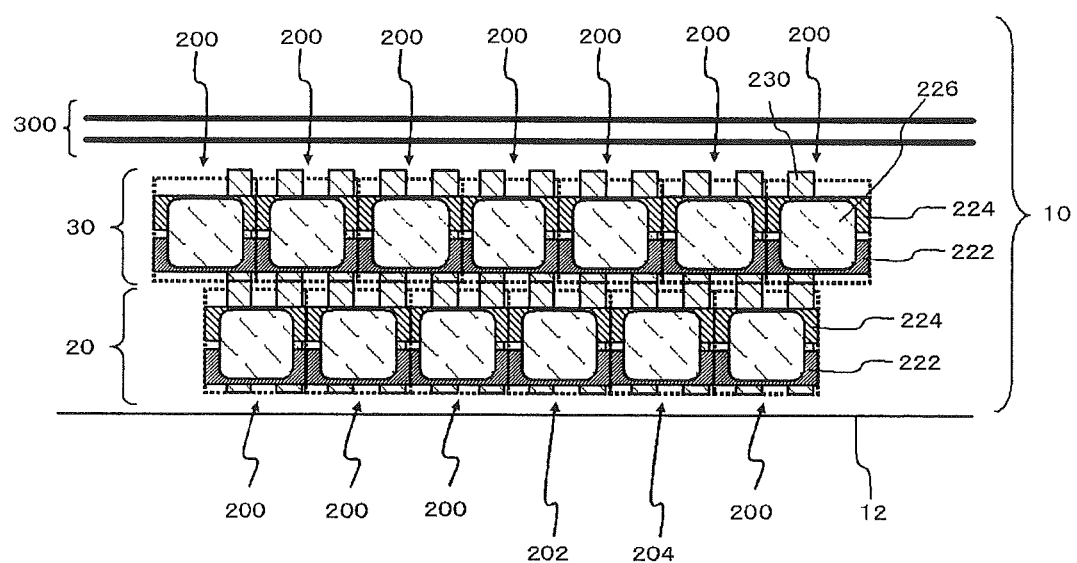
FIG. 11 is a plan view showing the configuration of a semiconductor chip according to a third embodiment.
Figure 12:
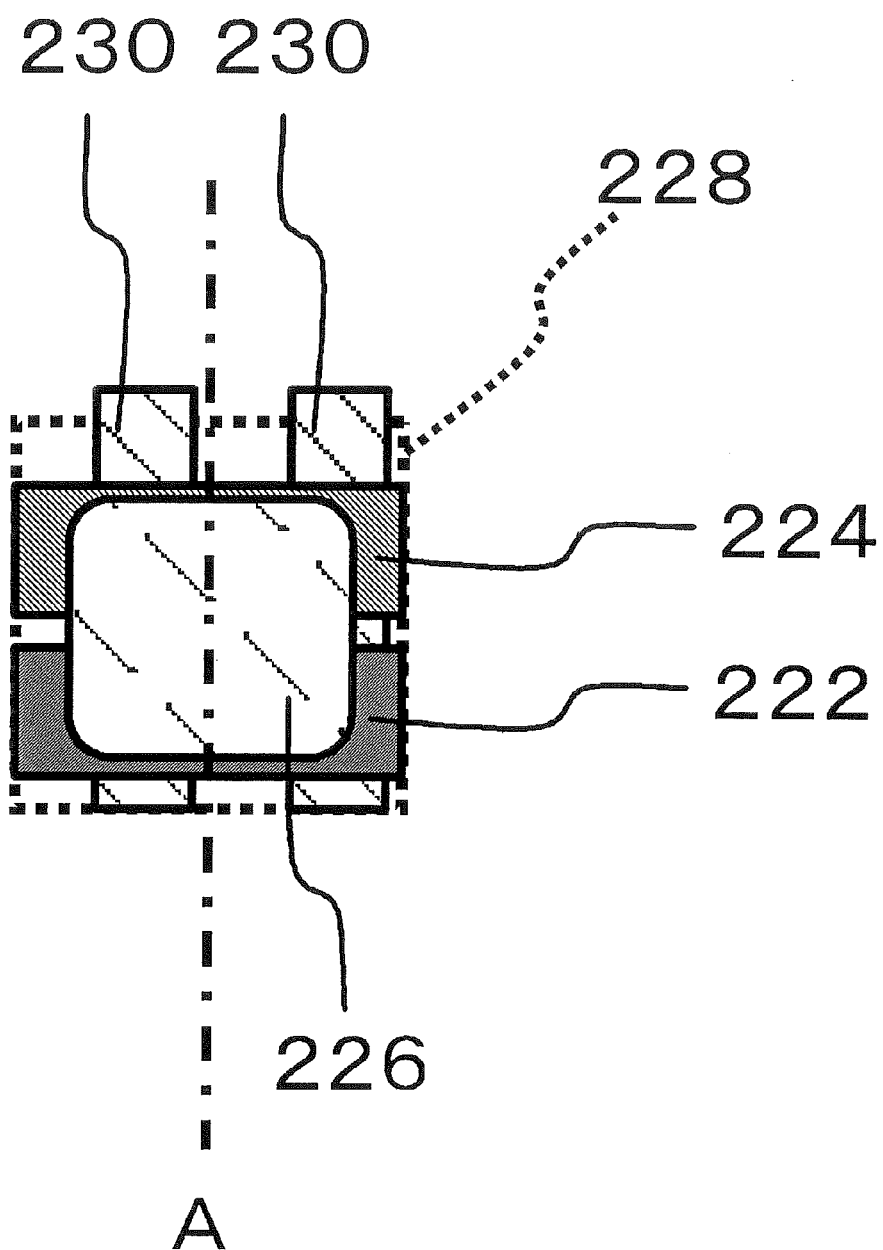
FIG. 12 is a plan view showing the configuration of an I/O cell used in FIG. 11.

FIG. 11 is a plan view showing the configuration of a semiconductor chip 10 according to a third embodiment, and corresponds to FIG. 1 in the first embodiment. FIG. 12 is a plan view showing the configuration of the I/O cell 200 used in FIG. 11. The semiconductor device according to the present embodiment has the same configuration as the semiconductor chip 10 according to the first embodiment except for the layout of the potential-supply connection interconnect 230 in each cell.

In the present embodiment, in each cell, the distance between the centers of the two potential-supply connection interconnects 230 is half of the distance between the centers of the I/O cells 200 adjacent to each other, as in the example shown in FIG. 1. The potential-supply connection interconnect 230 is repeated with the same shape in left and right halves of the I/O cell 200 in relation to the line passing through the center of the I/O cell 200. For example, it may be difficult to place the two potential-supply connection interconnects 230 axisymmetrically with respect to the reference line A as shown in FIG. 2 in the first embodiment, because the elements are located in the element arrangement region 228 of the lower layer. Also in such a case, if the same shape is repeated in the left and right halves as in the third embodiment, the axisymmetric arrangement is not necessarily required. As a result, the degree of freedom of the layout of the potential-supply connection interconnects 230 can be further improved, compared with that in the first embodiment.

(Fourth Embodiment)

Figure 13:
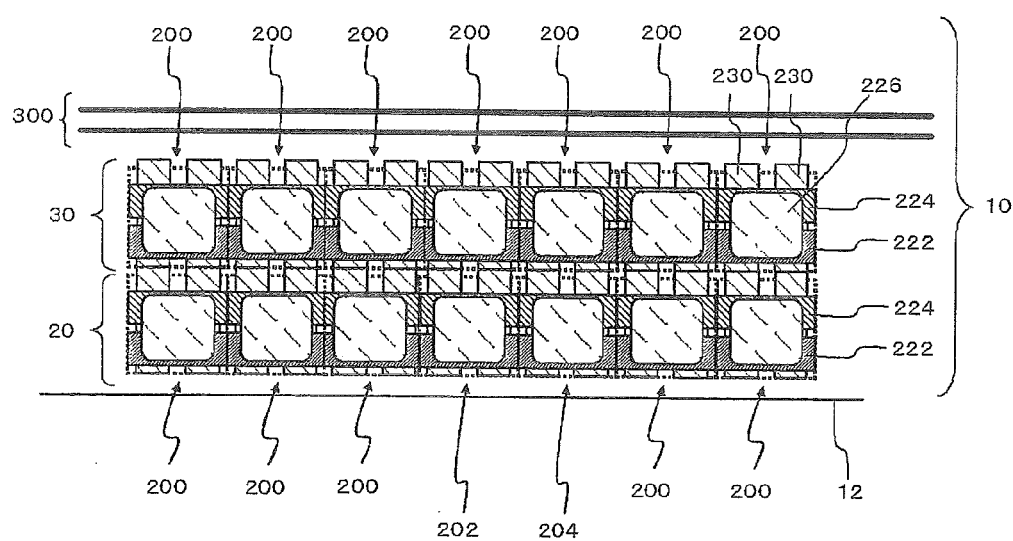
FIG. 13 is a plan view showing the configuration of a semiconductor chip according to a fourth embodiment.

FIG. 13 is a plan view showing the configuration of a semiconductor chip 10 according to a fourth embodiment, and corresponds to FIG. 1 in the first embodiment. The semiconductor device according to the present embodiment has the same configuration as the semiconductor chip 10 according to the first embodiment except that each cell of the outer peripheral cell column 20 and each cell of the inner peripheral cell column 30 are disposed at the same position in a direction along the edge 12. That is, in the present embodiment, a lattice (for example, a square lattice) is formed by each cell of the outer peripheral cell column 20 and each cell of the inner peripheral cell column 30. Each cell is disposed at the position serving as a lattice point. The layout in the present embodiment may also be adopted in the second embodiment.

Specifically, the center of the electrode pad 226 included in the outer peripheral cell column 20 and the center of the electrode pad 226 included in the inner peripheral cell column 30 are located at the same position in a direction along the edge 12. The potential-supply connection interconnect 230 extends from the below the electrode pad 226 of each cell in the outer peripheral cell column 20 to below the electrode pad 226 of each cell in the inner peripheral cell column 30. All potential-supply connection interconnects 230 extend in a direction perpendicular to the edge 12 of the semiconductor chip 10. The position of the potential-supply connection interconnect 230 with respect to the center of the electrode pad 226 is the same in all cells.

According to the present embodiment, it is possible to achieve the same effects as in the first embodiment, and it is not necessary to dispose alternately each cell of the outer peripheral cell column 20 and each cell of the inner peripheral cell column 30. Thus, an efficient layout with less dead space can be realized, and as a result, a larger number of I/O cells 200 can be arrayed.

(Fifth Embodiment)

Figure 14:
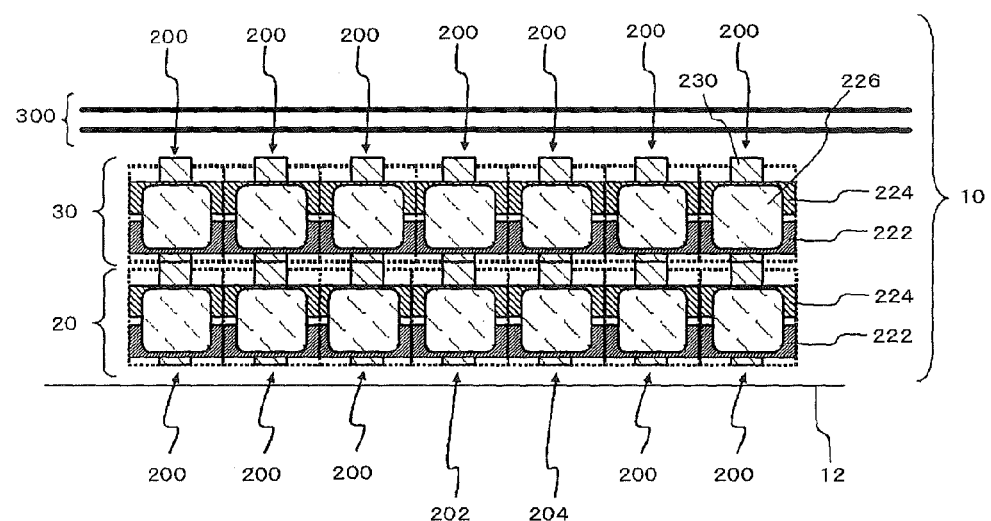
FIG. 14 is a plan view showing the configuration of a semiconductor chip according to a fifth embodiment.
Figure 15:
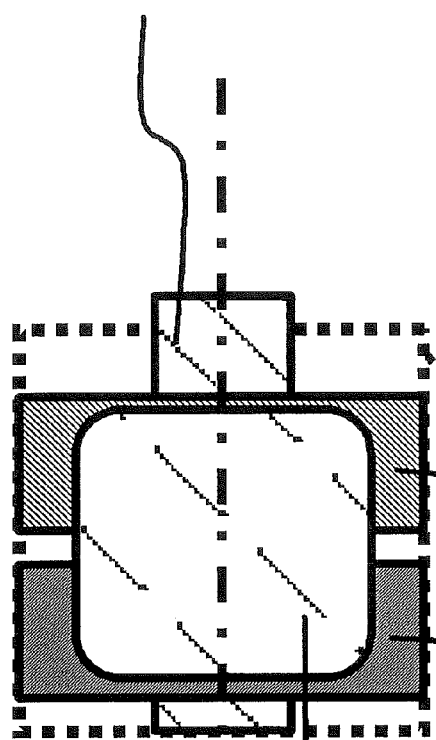
FIG. 15 is a plan view showing the configuration of an I/O cell used in FIG. 14.

FIG. 14 is a plan view showing the configuration of a semiconductor chip 10 according to a fifth embodiment, and corresponds to FIG. 13 in the fourth embodiment. FIG. 15 is a plan view showing the configuration of the I/O cell 200 used in FIG. 14. The semiconductor device according to the present embodiment has the same configuration as the semiconductor chip 10 according to the fourth embodiment except for the layout of the potential-supply connection interconnect 230 in each cell. In the present embodiment, the centerline B of a bundle of interconnects consisting of the potential-supply connection interconnects 230 passes through the center of the I/O cell 200.

Figure 16:
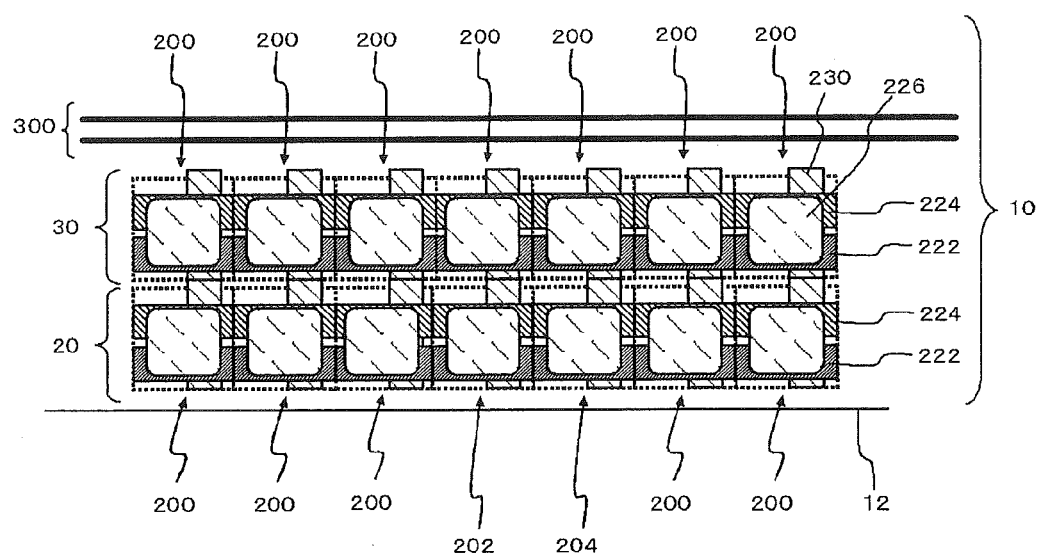
FIG. 16 is a plan view showing a modification of FIG. 14.

Alternatively, in the present embodiment, the centerline of the potential-supply connection interconnect 230 does not have to pass through the center of the I/O cell 200 as shown in FIG. 16.

According to the present embodiment, both the effects in the third embodiment and the effects in the fourth embodiment can be achieved.

(Sixth Embodiment)

Figure 17:
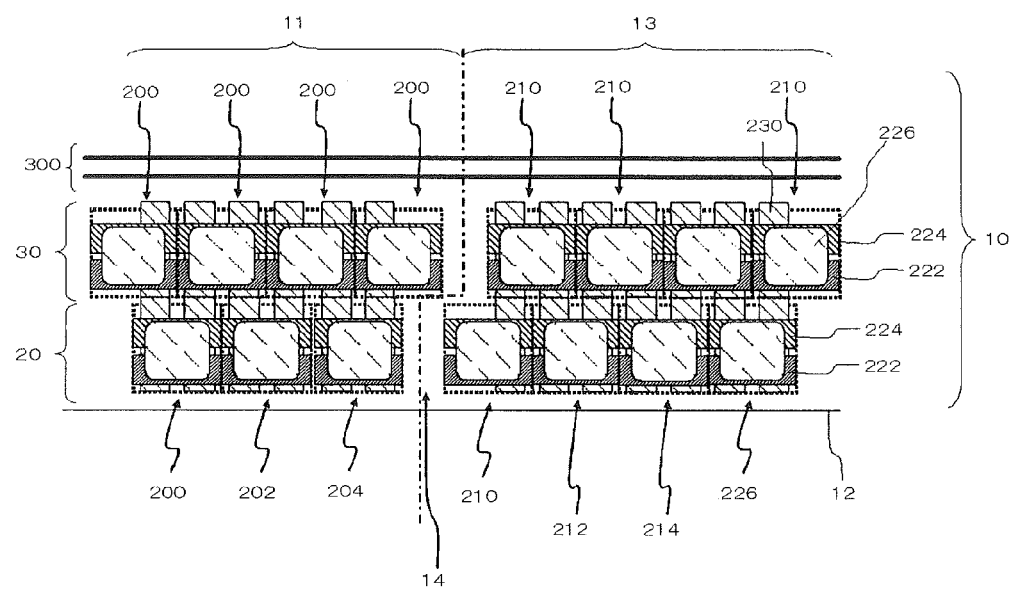
FIG. 17 is a plan view showing the configuration of a semiconductor chip according to a sixth embodiment.

FIG. 17 is a plan view showing the configuration of a semiconductor chip 10 according to a sixth embodiment, and corresponds to FIG. 1 in the first embodiment. The semiconductor chip 10 according to the present embodiment has the same configuration as the semiconductor chip 10 according to the first embodiment except for the following points.

First, each of the outer peripheral cell column 20 and the inner peripheral cell column 30 is divided into first and second cell groups 11 and 13. I/O cells 200 belonging to the first cell group 11 and I/O cells 210 belonging to the second cell group 13 are driven by different power potentials. A power potential supply cell 202 and a ground potential supply cell 204 are provided in the outer peripheral cell column 20 belonging to the first cell group 11. A power potential supply cell 212 and a ground potential supply cell 214 are provided in the outer peripheral cell column 20 belonging to the second cell group 13. The configuration of the power potential supply cell 212 and the ground potential supply cell 214 is the same as the configuration of the power potential supply cell 202 and the ground potential supply cell 204.

In each of the outer peripheral cell column 20 and the inner peripheral cell column 30, a power isolation region 14 is provided between the first and second cell groups 11 and 13. The power isolation region 14 is a region to provide a space between the first and second cell groups 11 and 13. The power potential supply interconnect 222 and the ground potential supply interconnect 224 are not provided in the power isolation region 14. In this way, insulation between the first and second cell groups 11 and 13 is ensured. Design data of the power isolation region 14 is stored in the cell data storage unit 512 of the semiconductor device design apparatus 500 shown in FIG. 6.

According to the present embodiment, it is possible to achieve the same effects as in the first embodiment, and the first and second cell groups 11 and 13 with different power potentials can be easily disposed in a set of cell columns. Moreover, the first and second cell groups 11 and 13 and the power isolation region 14 may also be provided in the second to fifth embodiments, in the same manner as in the present embodiment.

(Seventh Embodiment)

Figure 18:
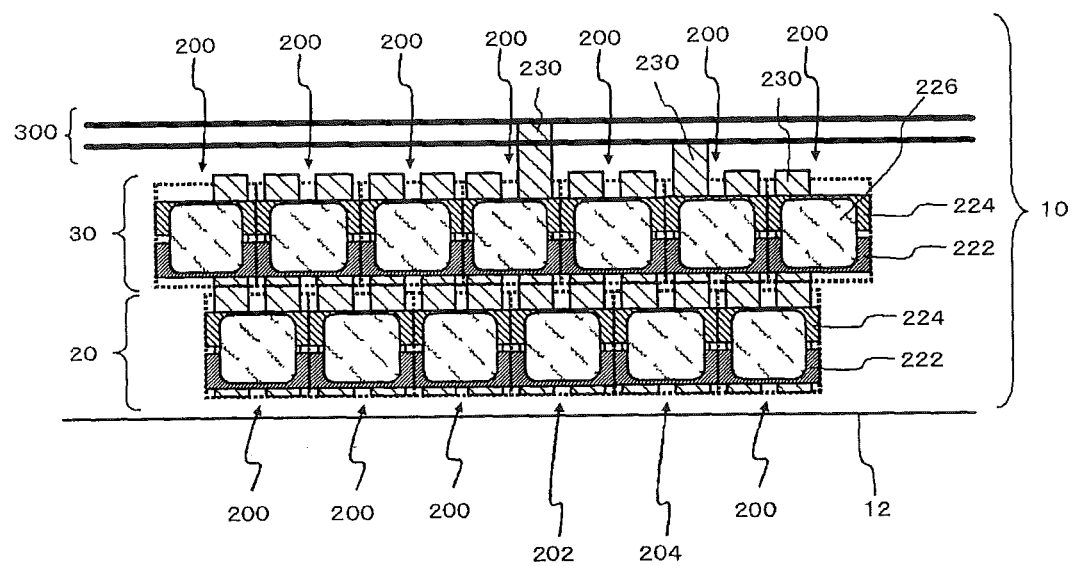
FIG. 18 is a plan view showing the configuration of a semiconductor chip according to a seventh embodiment.

FIG. 18 is a plan view showing the configuration of a semiconductor chip 10 according to a seventh embodiment, and corresponds to FIG. 1 in the first embodiment. The semiconductor chip 10 according to the present embodiment has the same configuration as the semiconductor chip 10 according to the first embodiment except that some potential supply-connection interconnects 230 included in the inner peripheral cell column 30 are connected to the inside circulating power supply interconnect 300.

According to the present embodiment, the same effects as in the first embodiment can be achieved. Additionally, when the power potential and the ground potential supplied to the outer peripheral cell column 20 and the inner peripheral cell column 30 are also supplied as a power potential and a ground potential of an internal circuit of the semiconductor chip 10, the power potential and the ground potential can be supplied to the inside circulating power supply interconnect 300 through the power potential supply cell 202 and the ground potential supply cell 204 of the outer peripheral cell column 20.

The potential-supply connection interconnect 230 may be connected to the inside circulating power supply interconnect 300 in the second to sixth embodiments, in the same manner as in the present embodiment.

(Eighth Embodiment)

Figure 19:
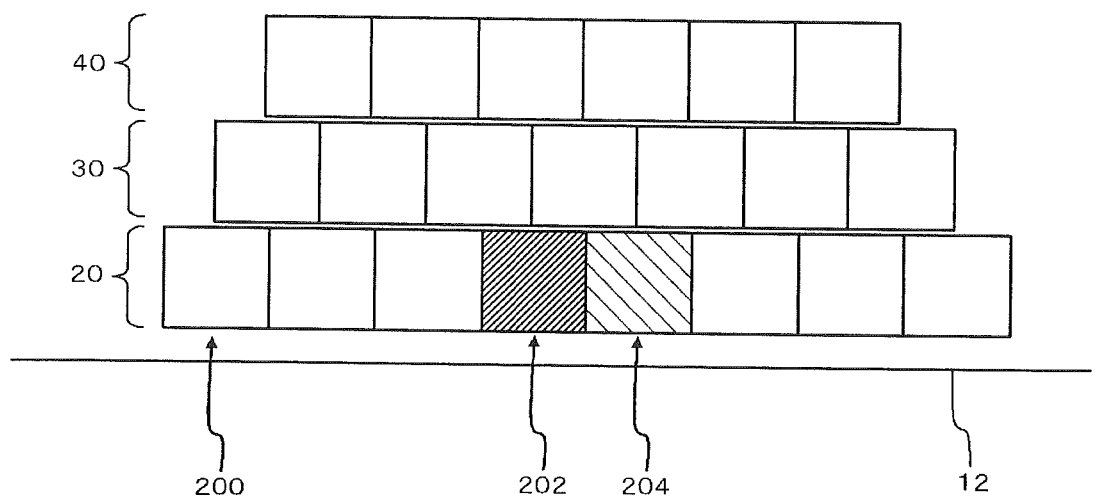
FIG. 19 is a view showing the layout of cells provided in a semiconductor chip according to an eighth embodiment.

FIG. 19 is a view showing the layout of an I/O cell 200, a power potential supply cell 202, and a ground potential supply cell 204 provided in a semiconductor chip 10 according to an eighth embodiment. In the present embodiment, an inner peripheral cell column 40 is further provided at the inner side of the inner peripheral cell column 30. The power potential supply cell 202 and the ground potential supply cell 204 are not provided in the inner peripheral cell column 40. The layout of the potential-supply connection interconnect 230 between the inner peripheral cell column 30 and the inner peripheral cell column 40 is the same as the layout of the potential-supply connection interconnect 230 between the outer peripheral cell column 20 and the inner peripheral cell column 30. Thus, the power potential supplied to the power potential supply cell 202 and the ground potential supplied to the ground potential supply cell 204 are supplied to the I/O cell 200 of the inner peripheral cell column 40 through the potential-supply connection interconnect 230 (not shown in FIG. 19). In the eighth embodiment, both the power potential and the ground potential can be supplied from the outermost peripheral cell column 20, and this eliminates the need for disposing the power potential supply cell 202 and the ground potential supply cell 204 in the inner peripheral cell columns 30 and 40. As a result, a larger number of I/O cells 200 can be arrayed in the inner peripheral cell columns 30 and 40.

Thus, the number of inner peripheral cell columns, that is, the number of stages of cells is arbitrarily set.

Figure 20:
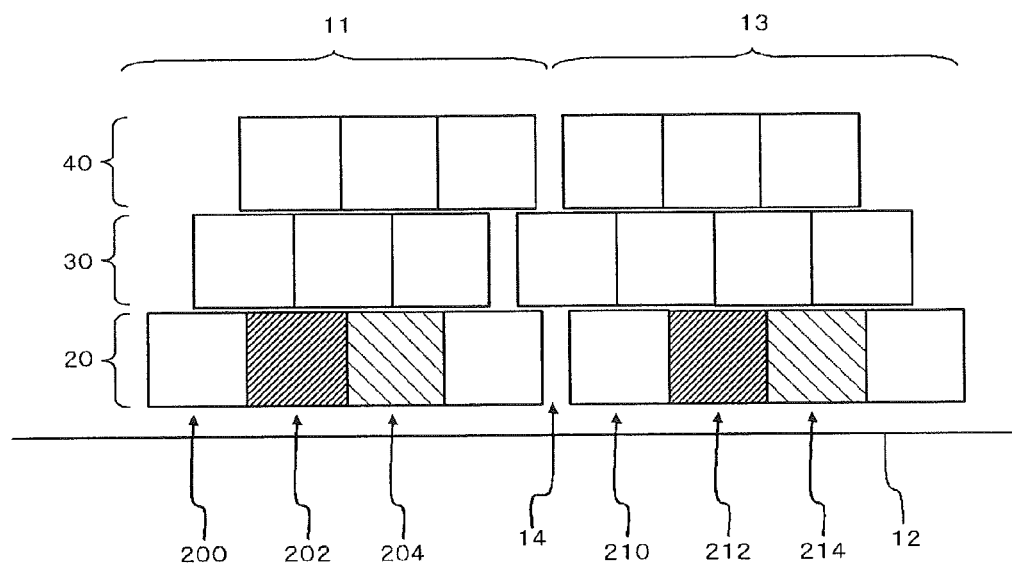
FIG. 20 is a view showing a modification of FIG. 19.

Moreover, in the present embodiment, the first and second cell groups 11 and 13 may be provided as shown in FIG. 20, in the same manner as in the sixth embodiment shown in FIG. 17. In this case, the power potential supply cell 202 and the ground potential supply cell 204 are provided in the outer peripheral cell column 20 of the first cell group 11 in the same manner as in FIG. 17. Furthermore, the power potential supply cell 212 and the ground potential supply cell 214 are provided in the outer peripheral cell column 20 of the second cell group 13 in the same manner as in FIG. 17. Moreover, also in the inner peripheral cell column 40, the power isolation region 14 is provided between the first and second cell groups 11 and 13, similar to the outer peripheral cell column 20 and the inner peripheral cell column 30. According to the eighth embodiment, both the effects in the sixth embodiment and the effects in the eighth embodiment can be achieved simultaneously.

(Ninth Embodiment)

Figure 21:
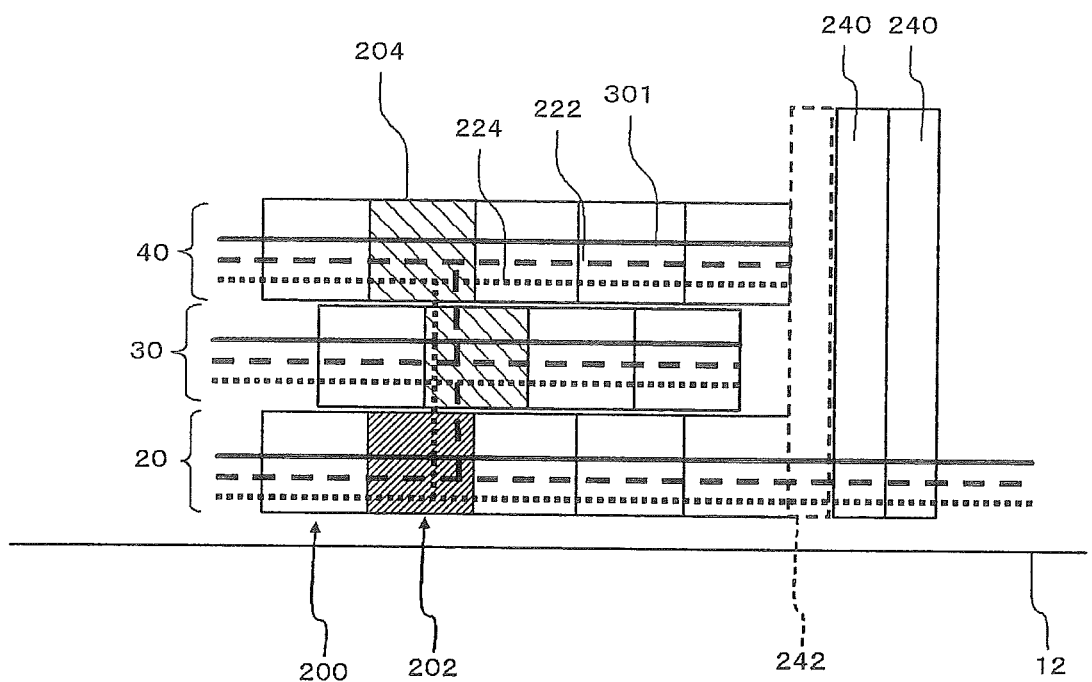
FIG. 21 is a view showing the layout of cells provided in a semiconductor chip according to a ninth embodiment.

FIG. 21 is a view showing the layout of cells provided in a semiconductor chip 10 according to a ninth embodiment. The layout in the present embodiment is the same as that in the semiconductor device according to the first embodiment except that an I/O cell 240 is provided beside the outer peripheral cell column 20 and the inner peripheral cell column 30. The power supply interconnect 301 shown in FIG. 32 is provided in the example shown in FIG. 21.

The I/O cell 240 has a different planar shape from the I/O cell 200. In the example shown in FIG. 21, the I/O cell 240 is longer than the I/O cell 200 in the direction perpendicular to the edge 12 and is located over both the outer peripheral cell column 20 and the inner peripheral cell column 30. The disposed I/O cell 240 is a single column. A height matching cell 242 is provided between the I/O cell 240 and the outer peripheral cell column 20 and between the I/O cell 240 and the inner peripheral cell column 30. Design data of the I/O cell 240 and design data of the height matching cell 242 are stored in the cell data storage unit 512 of the semiconductor device design apparatus 500 shown in FIG. 6.

Figure 31:
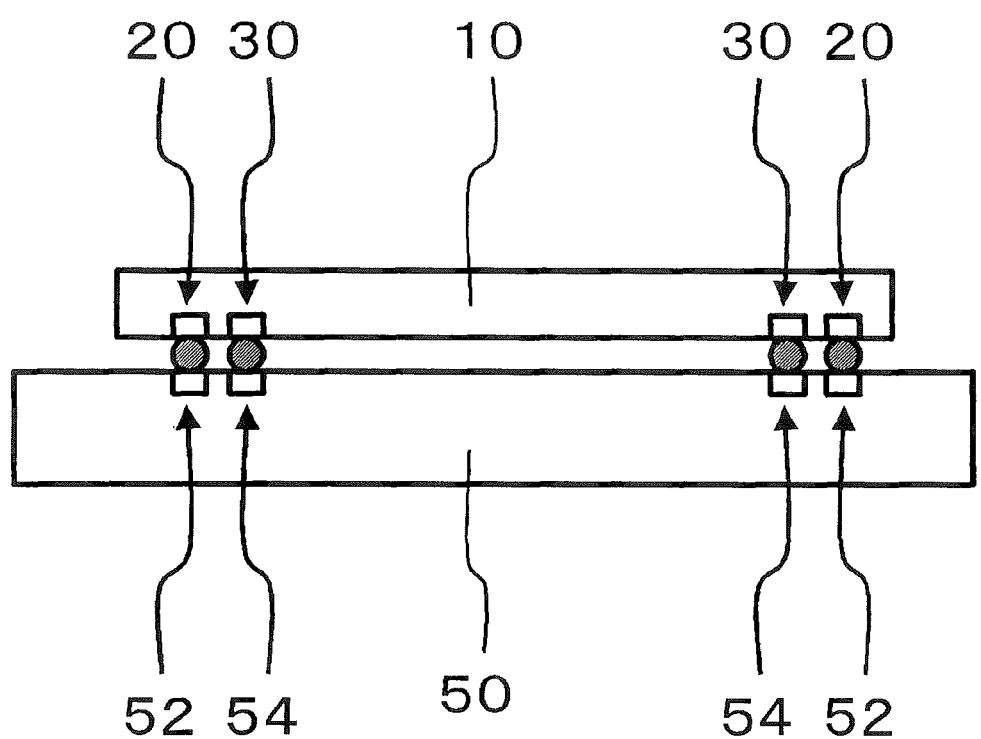
FIG. 31 is a sectional view showing the configuration of a semiconductor device according to a thirteenth embodiment.

Moreover, in the ninth embodiment, the I/O cell 200 (or the power potential supply cell 202 or the ground potential supply cell 204) included in the inner peripheral cell column 20 has the power potential supply interconnect 222 and the ground potential supply interconnect 224 as shown in FIG. 2. The distances from the edge 12 of the substrate to these interconnects are preferably equal to the distances from the edge 12 of the substrate to the power potential supply interconnect 222 and the ground potential supply interconnect 224 provided in the I/O cell 240. In this case, the I/O cells 200 and 240 with different shapes can be provided together in one semiconductor chip using the height matching cell 242. As a result, it is possible to realize a semiconductor chip with a higher degree of design freedom. Additionally, in the example shown in FIG. 21, each cell has the power supply interconnect 301 shown in FIG. 31.

Figure 22:
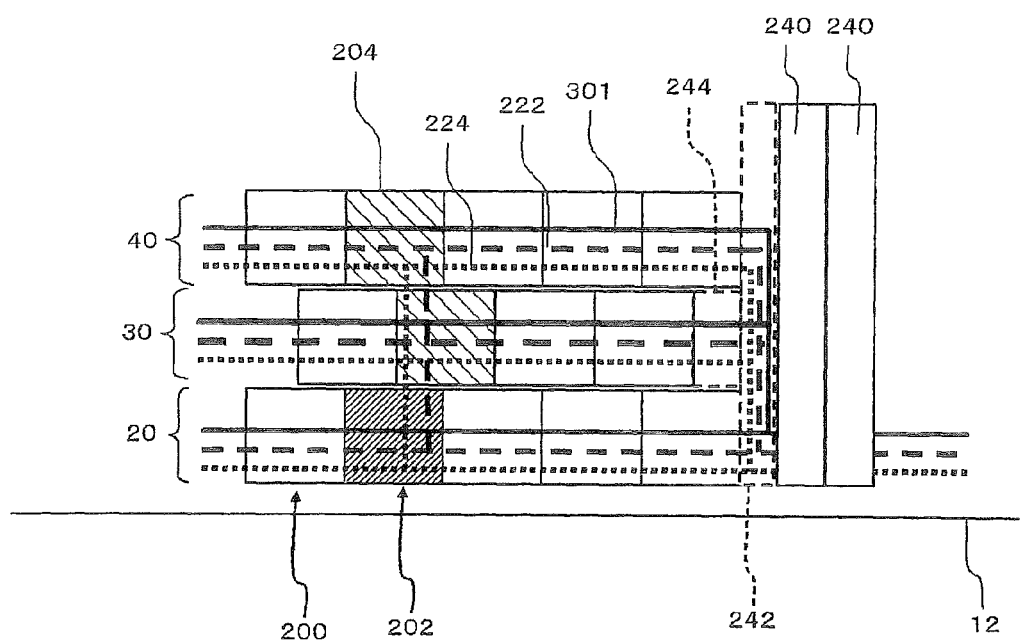
FIG. 22 is a view showing a modification of FIG. 21.

As shown in FIG. 22, it is preferable to prepare interconnects in the height matching cell 242 for connecting the power potential supply interconnect 222 and the ground potential supply interconnect 224 provided in the inner peripheral cell column 30, and the power potential supply interconnect 222 and the ground potential supply interconnect 224 provided in the inner peripheral cell column 40, to the power potential supply interconnect 222 and the ground potential supply interconnect 224 provided in the I/O cell 240. This improves the power supply of the inner peripheral cell column 30 or the inner peripheral cell column 40, and at the same time allows to freely dispose the I/O cells 200 and 240 with different shapes together. In this way, it is possible to realize a semiconductor chip to further improve the degree of design freedom. Moreover, in the present embodiment, there is a space between the inner peripheral cell column 30 on the second column and the height matching cell 242. For this reason, a cell 244 for disposing a power supply interconnect (including a ground interconnect) in this space is disposed. Thus, the power potential supply interconnect 222, the ground potential supply interconnect, and the power supply interconnect 301 in the inner peripheral cell column 30 on the second column are also connected to the power potential supply interconnect 222, the ground potential supply interconnect, and the power supply interconnect 301 in the outer peripheral cell column 20, respectively, through interconnects of the height matching cell 242.

The I/O cell 240 and the height matching cell 242 may also be provided in the second to eighth embodiments, in the same manner as in the present embodiment.

(Tenth Embodiment)

Figure 23:
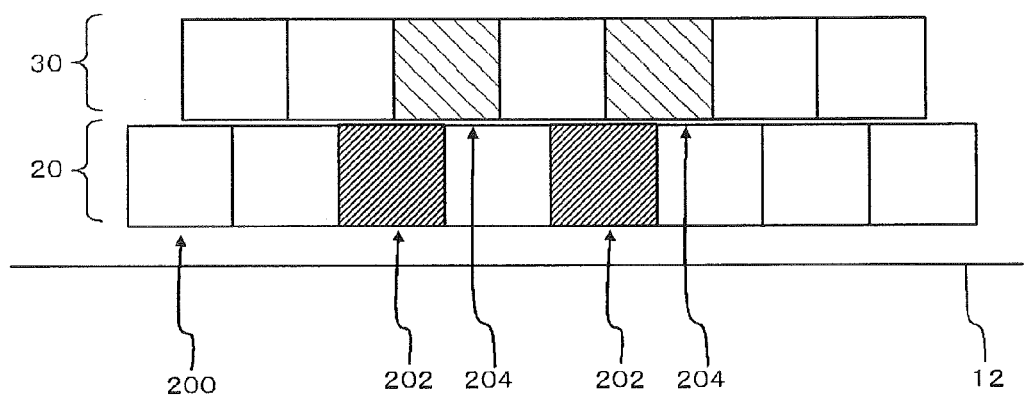
FIG. 23 is a view showing the layout of cells provided in a semiconductor chip according to a tenth embodiment.

FIG. 23 is a view showing the layout of cells provided in a semiconductor chip 10 according to a tenth embodiment. The layout in the present embodiment is the same as that in the first embodiment except that either the power potential supply cell 202 or the ground potential supply cell 204 is provided in the outer peripheral cell column 20 and the rest of the power potential supply cell 202 and the ground potential supply cell 204 is provided in the inner peripheral cell column 30.

In the example shown in FIG. 23, a plurality of power potential supply cells 202 are provided in the outer peripheral cell column 20, and a plurality of ground potential supply cells 204 are provided in the inner peripheral cell column 30. The provision of the plurality of power potential supply cells 202 and the plurality of ground potential supply cells 204 is for stabilizing the power potential and the ground potential.

Figure 24:
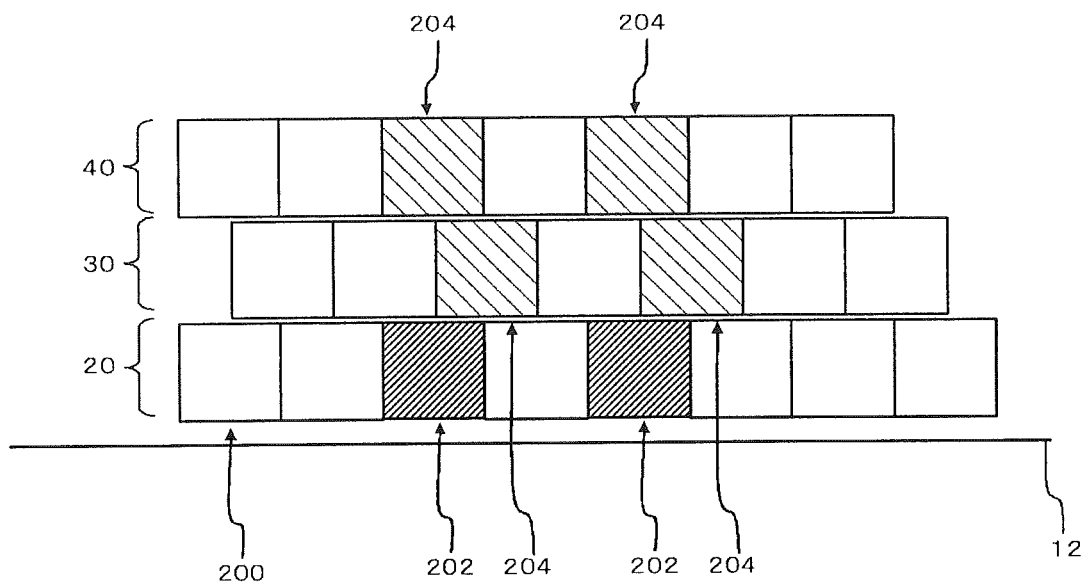
FIG. 24 is a view showing a modification of FIG. 23.
Figure 25:
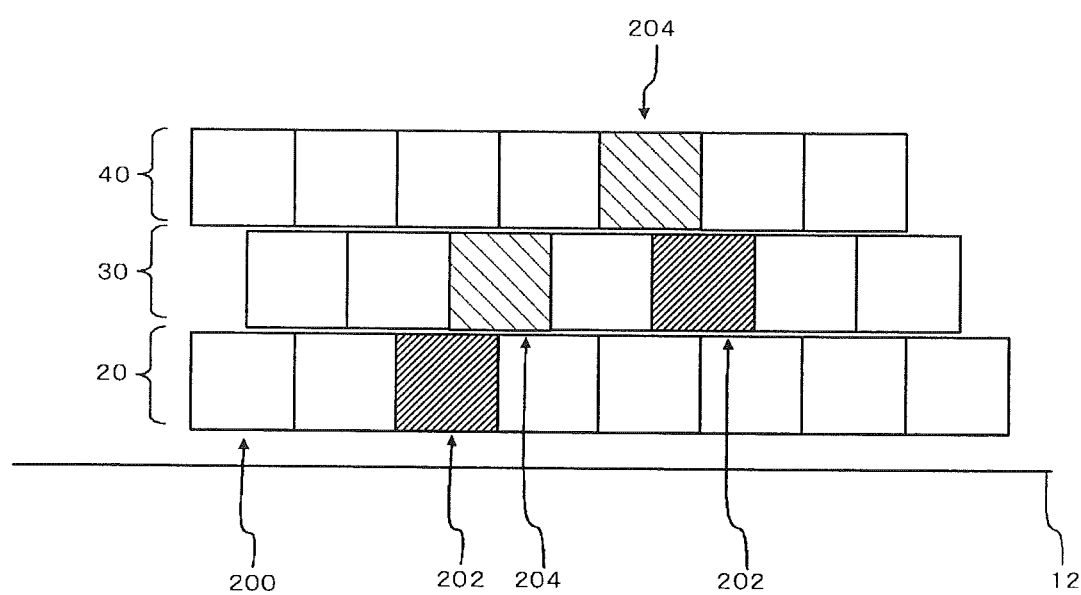
FIG. 25 is a view showing a modification of FIG. 23.

As shown in FIG. 24 and FIG. 25, the power potential supply cells 202 may be provided in different cell columns, and the ground potential supply cell 204 may be provided in different cell columns. Also in this case, the power potential and the ground potential can be made stable.

Specifically, in the example shown in FIG. 24, the power potential supply cells 202 are provided in a certain cell column (for example, the outer peripheral cell column 20), and the ground potential supply cells 204 are provided in the other cell columns (for example, the inner peripheral cell columns 30 and 40). In the example shown in FIG. 25, the first power potential supply cell 202 is provided in the outer peripheral cell column 20. The second power potential supply cell 202 and the first ground potential supply cell 204 are provided in the inner peripheral cell column 30. The second ground potential supply cell 204 is provided in the inner peripheral cell column 40. The way of disposing the first power potential supply cell 202 and the first ground potential supply cell 204 makes them partially overlapping each other from the viewpoint along the edge 12. The way of disposing the second power potential supply cell 202 and the second ground potential supply cell 204 also makes them partially overlapping each other from the viewpoint along the edge 12.

In both the cases described above, it is preferable that the way of disposing the power potential supply cell 202 (or the ground potential supply cell 204) located in a certain cell column and the power potential supply cell 202 or the ground potential supply cell 204 located in a cell column inward next to the certain cell column make them partially overlapping each other from the viewpoint along the edge 12. This makes it possible to directly connect the power potential supply cell 202 (or the ground potential supply cell 204) located in a certain cell column and the power potential supply cell 202 or the ground potential supply cell 204 located in a cell column inward next to the certain cell column through the potential-supply connection interconnect 230.

(Eleventh Embodiment)

Figure 26:
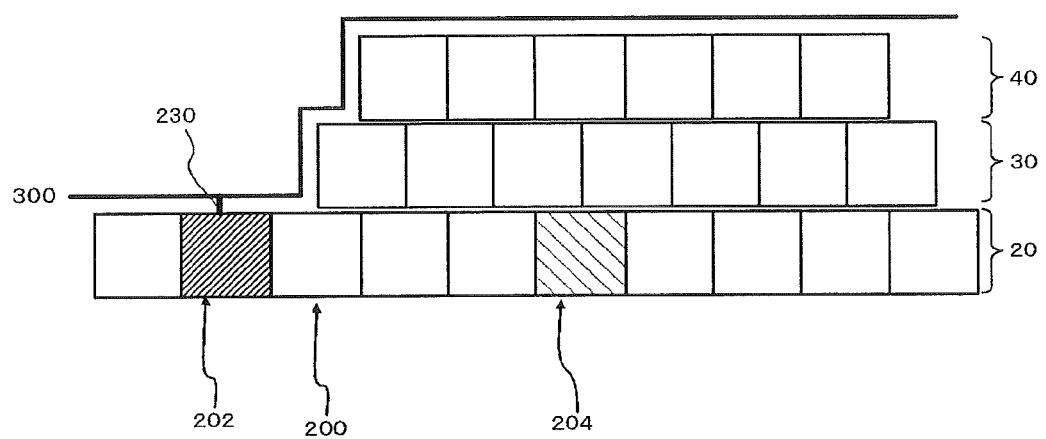
FIG. 26 is a view showing the layout of cells provided in a semiconductor chip according to an eleventh embodiment.

FIG. 26 is a view showing the layout of cells provided in a semiconductor chip 10 according to an eleventh embodiment. In the layout in the present embodiment, the inner peripheral cell column 30 and the inner peripheral cell column 40 are provided at positions overlapping a part of the outer peripheral cell column 20. The power potential supply cell 202 is disposed in a region of the outer peripheral cell column 20 not overlapping the inner peripheral cell column 30 and the inner peripheral cell column 40. In this region, the inside circulating power supply interconnect 300 is routed just inside the outer peripheral cell column 20. The power potential supply cell 202 is connected directly to the inside circulating power supply interconnect 300 through the potential-supply connection interconnect 230. In this case, a power potential can be supplied from the power potential supply cell 202 to directly the inside circulating power supply interconnect 300. Accordingly, parasitic resistance of an interconnect and the like causes very few potential drop. As a result, the power potential of the inside circulating power supply interconnect 300 can be made stable.

Figure 27:
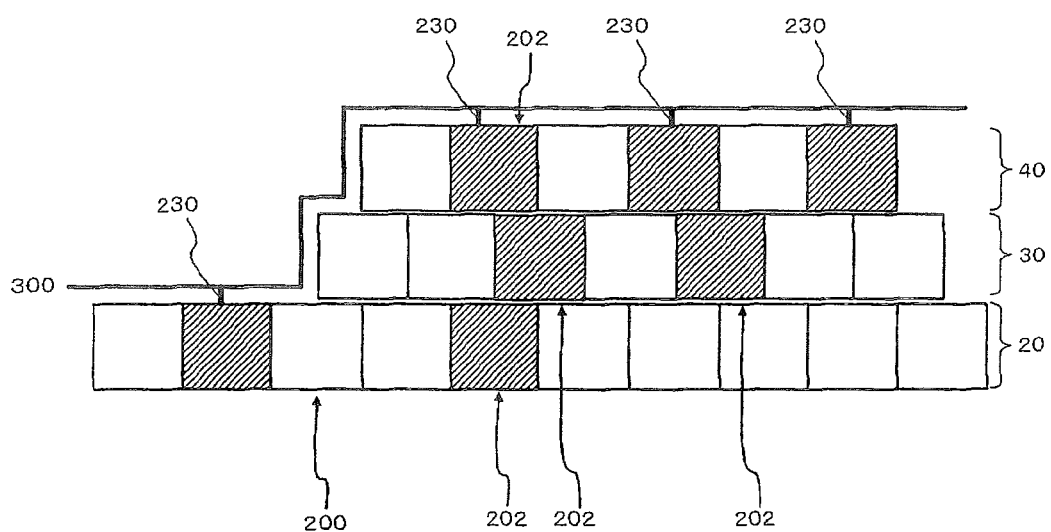
FIG. 27 is a view showing a modification of FIG. 26.

In addition, as shown in FIG. 27, when the power potential supply cell 202 is provided in the inner peripheral cell column 40, the power potential supply cell 202 provided in the inner peripheral cell column 40 may be connected to the inside circulating power supply interconnect 300 through the potential-supply connection interconnect 230.

In the example shown in FIG. 27, the power potential supply cell 202 (or the ground potential supply cell 204: not shown in FIG. 27) is provided in each of the outer peripheral cell column 20, the inner peripheral cell column 30, and the inner peripheral cell column 40. The way of disposing the power potential supply cell 202 provided in the outer peripheral cell column 20 makes it partially overlapping the power potential supply cell 202 provided in the inner peripheral cell column 30 from the viewpoint along the edge 12. This makes it possible to directly connect the power potential supply cell 202 of the outer peripheral cell column 20 and the power potential supply cell 202 of the inner peripheral cell column 30 through the potential-supply connection interconnect 230.

The way of disposing the power potential supply cell 202 provided in the inner peripheral cell column 30 makes it partially overlapping the power potential supply cell 202 provided in the inner peripheral cell column 40. This makes it possible to directly connect the power potential supply cell 202 of the inner peripheral cell column 30 and the power potential supply cell 202 of the inner peripheral cell column 40 through the potential-supply connection interconnect 230. This prevents parasitic resistance of an interconnect and the like from influencing a potential drop on the inside circulating power supply interconnect 300. As a result, the power potential of the inside circulating power supply interconnect 300 can be made stable.

Figures 28A, 28B:
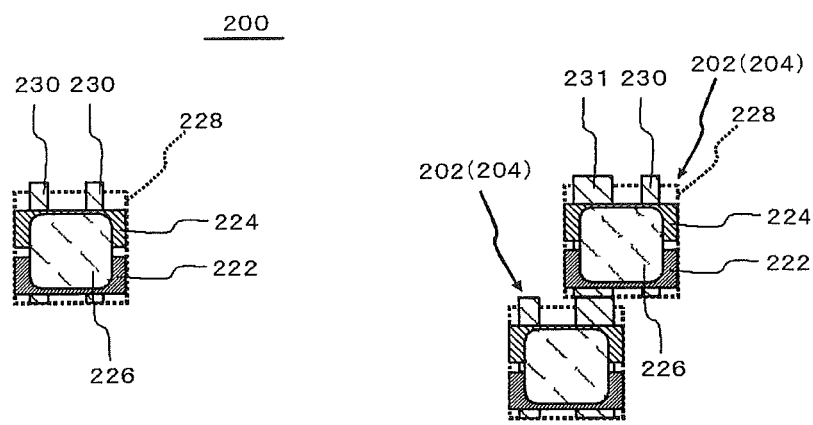
FIG. 28A is a view showing the configuration of an I/O cell.
FIG. 28B is a view showing the configuration of two vertically-arranged power potential supply cells (or two ground potential supply cells)

FIGS. 28A and 28B are views showing the layout (FIG. 28B) of two power potential supply cells 202 (or two ground potential supply cells 204) located above and below each other compared with the layout (FIG. 28A) of the I/O cell 200. As shown in FIG. 28A, the plurality of potential-supply connection interconnects 230 provided in the I/O cell 200 have the same thickness. In contrast, as shown in FIG. 28B, when the two power potential supply cells 202 are located above and below each other, a potential-supply connection interconnect 231 for connecting the two power potential supply cells 202 has a larger thickness than the other potential-supply connection interconnects 230. In this way, it is possible to suppress the occurrence of a power potential difference between the plurality of power potential supply cells 202.

Design data of potential supply cells for multiple stages shown in FIG. 28B is stored in the cell data storage unit 512 of the semiconductor device design apparatus 500 shown in FIG. 6.

(Twelfth Embodiment)

Figure 29:
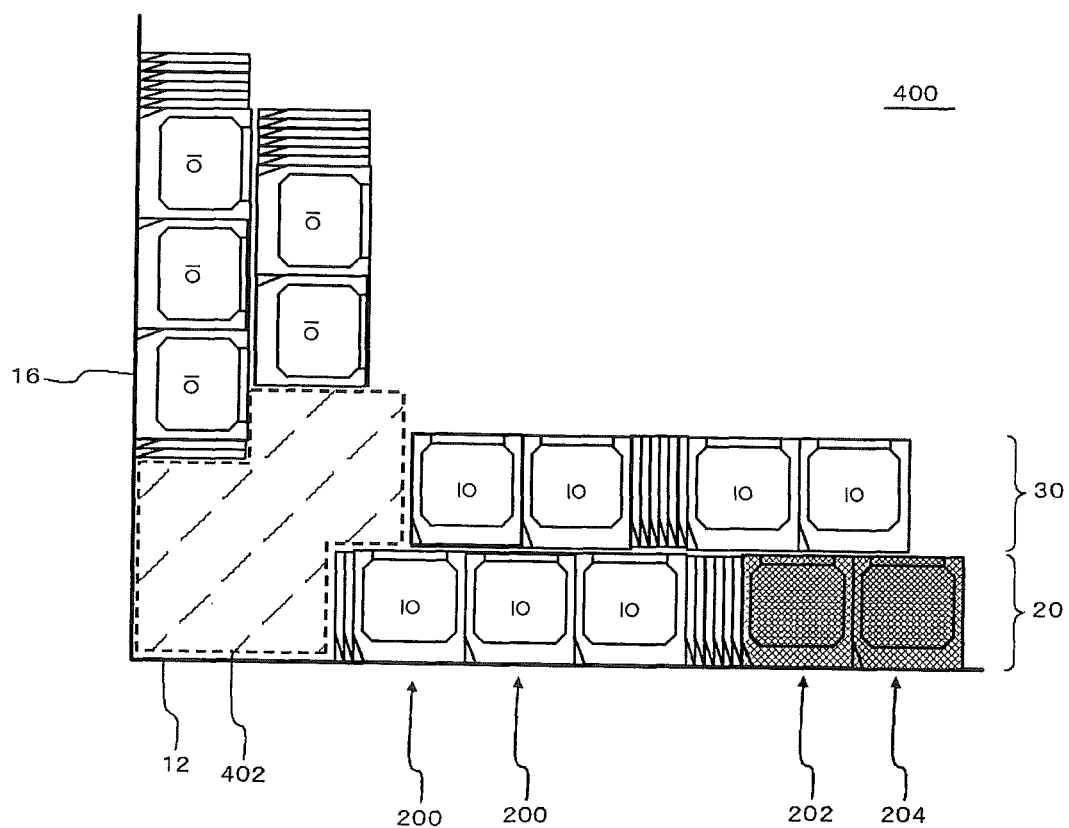
FIG. 29 is a view showing the layout of cells provided in a semiconductor chip according to a twelfth embodiment.

FIG. 29 is a view showing the layout of cells provided in a semiconductor chip 10 according to a twelfth embodiment. The layout shown in FIG. 29 shows a layout 400 in the corner of the semiconductor chip 10. The outer peripheral cell column 20 and the inner peripheral cell column 30 are provided in each of the edges 12 and 16 that form the corner. A cell non-place region 402 is set near the corner. The cell non-place region 402 is a region where no cell is disposed. The way of arraying cells along the edge 12 and cells along the edge 16 prevents them from interfering with each other.

Figure 30:
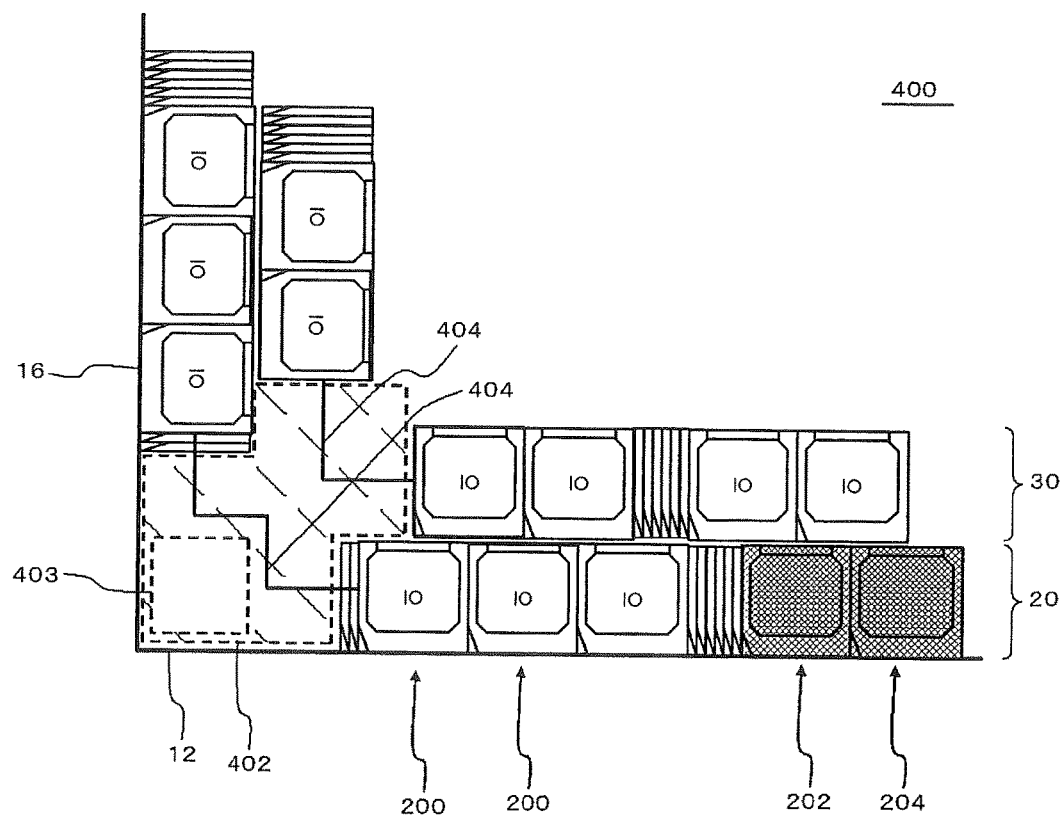
FIG. 30 is a view illustrating the layout of cells provided in the semiconductor chip according to the twelfth embodiment.

FIG. 30 is a view for explaining the layout shown in FIG. 29. As shown in FIG. 30, a minimum required cell non-place region in the shape shown in FIG. 29 is originally a region indicated by reference numeral 403. Still, as indicated by reference numeral 402 in FIG. 29, a cell non-place region is superfluously secured. In this case, if an interconnect 404 for making a connection between power supplies of cell columns disposed separately at each side of the semiconductor chip 10 is arbitrarily disposed in a partial region of the cell non-place region 402 as shown in FIG. 30, it becomes possible to supply electric power commonly to cell columns placed at each side. As a result, a larger number of I/O cells 200 can be arrayed in the semiconductor chip 10.

Design data of the layout 400 is stored in the cell data storage unit 512 of the semiconductor device design apparatus 500 shown in FIG. 6.

(Thirteenth Embodiment)

FIG. 30 is a sectional view showing the configuration of a semiconductor device according to a thirteenth embodiment. The semiconductor device according to the present embodiment has the same configuration as the semiconductor device according to each of the above embodiments except that the semiconductor chip 10 is connected to the interconnect substrate 50 through flip-chip bonding.

Also in the present embodiment, it is possible to increase the number of I/O cells 200.

While the embodiments of the present invention have been described with reference to the drawings, these are only illustrations of the present invention, and other various configurations may also be adopted. For example, although the potential-supply connection interconnect 230 extends in a straight-line manner in a direction perpendicular to the edge 12 of the semiconductor chip 10 in each of the embodiments described above, the potential-supply connection interconnect 230 may extend in a step-wise manner. Moreover, although the potential-supply connection interconnect 230 is disposed in each cell in each of the embodiments described above, there may be a cell in which the potential-supply connection interconnect 230 is not provided.

It is apparent that the present invention is not limited to the above embodiment, and may be modified and changed without departing from the scope and spirit of the invention.

What is claimed is:

1. A semiconductor device comprising:
    a semiconductor chip, the semiconductor chip including:
        a substrate;
        a multilayer interconnect layer formed over the substrate;
        a first cell column disposed along an edge of the substrate in a plan view, the first cell column having a first I/O cell and a first power supply cell;
        a second cell column disposed along the first cell column in plan view, the second cell column having a second I/O cell;
        a first pad supplying a first supply voltage to the first power supply cell;
        a first voltage supply wire disposed over the first cell column;
        a second voltage supply wire disposed over the second cell column; and
        a first connection wire which electrically connects the first voltage supply wire and the second voltage supply wire;
        wherein the first I/O cell is supplied with a first power supply voltage by the first voltage supply wire, and
        wherein the second I/O cell is supplied with the first power supply voltage by the first voltage supply wire, the first connection wire and the second voltage supply wire.

2. The semiconductor device according to claim 1, wherein the semiconductor chip includes:
    a third voltage supply wire disposed over the first cell column;
    a fourth voltage supply wire disposed over the second cell column; and
    a second pad supplying a second supply voltage to the second power supply cell;
    a second connection wire which electrically connects the third voltage supply wire and the fourth voltage supply wire,
    wherein the first I/O cell is supplied with the second power supply voltage via the third voltage supply wire, and
    wherein the second I/O cell is supplied with the second power supply voltage via the third voltage supply wire, the second connection wire and the fourth voltage supply wire.

3. The semiconductor device according to claim 2, wherein the first connection wire and the second connection wire are formed in another or the interconnect layer below the uppermost interconnect layer.

4. The semiconductor device according to claim 2, wherein the first connection wire and the second connection wire are formed to overlap the first I/O cells and the second I/O cells in a plan view.

5. The semiconductor device according to claim 2, wherein the first power supply cell and the second power supply cell are not provided in the second cell column.

6. The semiconductor device according to claim 2, wherein the first I/O cell and the second I/O cell inward next to the first cell column are disposed at the same position relative to a direction along the edge of the substrate.

7. The semiconductor device according to claim 2, wherein the first I/O cell and the second I/O cell inward next to the first cell column are disposed alternately in a direction along the edge of the substrate.

8. The semiconductor device according to claim 1, wherein the first pad is formed in an uppermost interconnect layer of the multilayer interconnect layer, and the first connection wire is formed in an interconnect layer of the multilayer interconnect layer which is other than the uppermost interconnect layer.

9. The semiconductor device according to claim 1, wherein the first and second cell columns and the first and second voltage supply wires extend in a first direction, and the first connection wire extends in a second direction perpendicular to the first direction.

10. The semiconductor device according to claim 1, wherein the semiconductor chip further includes:
- a third voltage supply wire disposed over the first cell column;
- a fourth voltage supply wire disposed over the second cell column; and
- a second connection wire which electrically connects the third voltage supply wire and the fourth voltage supply wire.

11. The semiconductor device according to claim 10, wherein the first pad is formed in an uppermost interconnect layer of the multilayer interconnect layer, and the first connection wire and the second connection wire are formed in an interconnect layer of the multilayer interconnect layer which is other than the uppermost interconnect layer.

12. The semiconductor device according to claim 10, wherein the first connection wire and the second connection wire overlap the first I/O cell and the second I/O cell in a plan view.

13. A semiconductor chip, comprising:
- a substrate;
- a multilayer interconnect layer formed over the substrate;
- a first cell column disposed along an edge of the substrate in a plan view, the first cell column having a first I/O cell and a first power supply cell;
- a second cell column disposed along the first cell column in plan view, the second cell column having a second I/O cell;
- a first pad supplying a first supply voltage to the first power supply cell;
- a first voltage supply wire disposed over the first cell column and supplying the first I/O cell with a first power supply voltage;
- a second voltage supply wire disposed over the second cell column; and
- a first connection wire which electrically connects the first voltage supply wire and the second voltage supply wire, the second I/O cell being supplied with the first power supply voltage by the first and second voltage supply wires and the first connection wire.

14. A semiconductor device, comprising:
a wiring substrate; and
a semiconductor chip mounted on the wiring substrate, the semiconductor chip comprising:
- a substrate;
- a multilayer interconnect layer formed over the substrate;
- a first cell column extending in a first direction along an edge of the substrate in a plan view, the first cell column having a first I/O cell and a first power supply cell;
- a second cell column extending in the first direction along the first cell column in plan view, the second cell column having a second I/O cell;
- a first pad formed in an uppermost interconnect layer of the multilayer interconnect layer, and supplying a first supply voltage to the first power supply cell;
- a first voltage supply wire extending in the first direction over the first cell column and supplying the first I/O cell with a first power supply voltage;
- a second voltage supply wire extending in the first direction over the second cell column; and
- a first connection wire formed in an interconnect layer of the multilayer interconnect layer which is other than the uppermost interconnect layer, and extending in a second direction perpendicular to the first direction, wherein the first connection wire electrically connects the first voltage supply wire and the second voltage supply wire, and the second I/O cell is supplied with the first power supply voltage by the first and second voltage supply wires and the first connection wire.

* * * * *